(12) United States Patent
Hornick et al.

(10) Patent No.: US 8,900,009 B2
(45) Date of Patent: Dec. 2, 2014

(54) APPARATUS AND METHODS FOR SUPPORTING AN ARTICLE

(75) Inventors: David Hornick, Englewood, CO (US);
Tamas Kovacs, Basalt, CO (US);
Anthony Velasquez, Longmont, CO (US)

(73) Assignee: iOmounts LLC., Basalt, CO (US)

( * ) Notice: Subject to any disclaimer, the term of this patent is extended or adjusted under 35 U.S.C. 154(b) by 324 days.

(21) Appl. No.: 13/595,926

(22) Filed: Aug. 27, 2012

(65) Prior Publication Data

US 2013/0078855 A1    Mar. 28, 2013

Related U.S. Application Data

(60) Provisional application No. 61/527,471, filed on Aug. 25, 2011.

(51) Int. Cl.
| | | |
|---|---|---|
| *H01R 13/73* | (2006.01) | |
| *F16M 13/02* | (2006.01) | |
| *F16M 13/00* | (2006.01) | |
| *F16M 11/20* | (2006.01) | |
| *F16M 11/04* | (2006.01) | |
| *F16M 11/14* | (2006.01) | |
| *G06F 1/16* | (2006.01) | |

(52) U.S. Cl.
CPC ............. *H01R 13/73* (2013.01); *F16M 13/02* (2013.01); *F16M 13/00* (2013.01); *F16M 11/2007* (2013.01); *F16M 11/041* (2013.01); *F16M 11/14* (2013.01); *G06F 1/1632* (2013.01); *F16M 13/022* (2013.01); *F16M 11/2092* (2013.01)
USPC .......................... 439/571; 249/288.51; 439/38

(58) Field of Classification Search
USPC ........ 439/305, 38–40, 571; 248/181.1, 181.2, 248/288.31, 288.51, 206.5
See application file for complete search history.

(56) References Cited

U.S. PATENT DOCUMENTS

| | | | | |
|---|---|---|---|---|
| 1,405,221 | A * | 1/1922 | Jenkins .......................... | 362/398 |
| 2,323,148 | A * | 6/1943 | McLaughlin ............... | 174/50.53 |
| 4,066,231 | A * | 1/1978 | Bahner et al. ................. | 248/552 |
| 4,160,285 | A * | 7/1979 | Shibla ........................... | 362/145 |
| 4,719,549 | A * | 1/1988 | Apel ............................. | 362/398 |
| 4,967,323 | A * | 10/1990 | Johnson et al. ............... | 362/103 |
| 5,067,834 | A * | 11/1991 | Szmanda et al. ............. | 400/489 |

(Continued)

FOREIGN PATENT DOCUMENTS

KR    20-0193406    8/2000

OTHER PUBLICATIONS

PCT/US2012/052557 International Search Report and Written Opinion, mailed Mar. 25, 2013, 11 pgs.

*Primary Examiner* — Briggitte R Hammond
(74) *Attorney, Agent, or Firm* — Marsh Fischmann & Breyfogle LLP

(57) ABSTRACT

A mount for supportably engaging an article. The mount includes a bulbous member that may include a convexly shaped surface area. The convexly shaped surface area may be supportively contactable with a first interconnect portion of a carrier member. An attachment member that is operatively associable with a device may be removably engageable with a second interconnect portion of the carrier member. The carrier member may be moved throughout a continuum of positions defined by the convexly curved surface area of the bulbous member. Additionally, the bulbous member may be supportably engaged by a variety of embodiments of support structures for supporting or mounting the mount.

31 Claims, 20 Drawing Sheets

(56) References Cited

U.S. PATENT DOCUMENTS

| | | | |
|---|---|---|---|
| 6,350,076 B1* | 2/2002 | Wagner et al. | 403/135 |
| 6,537,199 B1* | 3/2003 | Muller et al. | 600/25 |
| 7,556,228 B2* | 7/2009 | Liow et al. | 248/206.5 |
| 7,909,521 B2* | 3/2011 | Son | 396/428 |
| 8,238,086 B2* | 8/2012 | Ou | 361/679.21 |
| RE43,806 E* | 11/2012 | Carnevali | 248/181.1 |
| 2005/0247845 A1* | 11/2005 | Li et al. | 248/346.5 |
| 2007/0014084 A1 | 1/2007 | Jobs et al. | |
| 2007/0114346 A1* | 5/2007 | Omps | 248/181.1 |
| 2007/0201197 A1* | 8/2007 | Hillman et al. | 361/681 |
| 2008/0017764 A1* | 1/2008 | Nan | 248/133 |
| 2009/0146033 A1* | 6/2009 | Chiang | 248/284.1 |
| 2009/0196597 A1 | 8/2009 | Messinger et al. | |
| 2010/0183179 A1 | 7/2010 | Griffin, Jr. et al. | |
| 2011/0014378 A1* | 1/2011 | Bussan et al. | 427/275 |
| 2011/0039424 A1* | 2/2011 | Di Stefano | 439/66 |
| 2011/0148352 A1 | 6/2011 | Wang et al. | |
| 2011/0297566 A1* | 12/2011 | Gallagher et al. | 206/320 |
| 2012/0273630 A1* | 11/2012 | Gillespie-Brown et al. | 248/122.1 |

* cited by examiner

APPARATUS AND METHODS FOR SUPPORTING AN ARTICLE

CROSS-REFERENCE TO RELATED APPLICATION

This application is a non-provisional of U.S. Patent Provisional Application No. 61/527,471, entitled: "APPARATUS AND METHODS FOR SUPPORTING AN ARTICLE" filed on Aug. 25, 2011. The contents of the above application are incorporated by reference herein as if set forth in full.

FIELD OF THE INVENTION

The present application is generally directed to apparatuses and methods for physically supporting an article, wherein a user may view and/or otherwise interact with the article when the article is not held, carried, or otherwise physically supported by the user. In particular, the present application is directed to supporting a device (e.g. an electronic device such as, for example, a portable electronic device) to facilitate visual and/or other interaction of a user with the device when the device is not held, carried or otherwise physically supported by the user.

BACKGROUND

Physical support structures are often useful to physically support an article without requiring that an individual hold, carry, or otherwise physically support the article. For example, many devices (e.g., electronic devices) include physical support structures that allow the devices to be physically supported without the intervention of a user.

Recently, the prevalence and use of personal electronic devices has grown. Often times these personal electronic devices are portable and designed to facilitate easy transport by a user (e.g., by physically holding the device, stowing the device in the user's clothing and/or belongings, etc.). Accordingly, portability may be a key design factor for such portable electronic devices. However, as portable electronic devices are more commonly used, users of portable electronic devices may desire that the devices be physically supported so that the device may be interacted with (e.g., viewed, manipulated, used, or otherwise interacted with) without requiring the individual to physically support the device.

In one example, a user may desire to physically support a cellular telephone without the user having to physically support the device. For instance, the user may want a convenient location to dispose the device when not in use such that the telephone may still be viewed, easily accessed, and/or otherwise interacted with (e.g., to visually monitor a phone display, dial the phone, answer a telephone call, be within range of a microphone of the telephone, etc.), without having to hold, carry, or otherwise support the telephone.

In another example, portable tablet computer devices are becoming more commonly used as primary or auxiliary monitors for displaying graphics, video and the like. However, as such tablet computer devices are often designed to be portable, the user of a tablet computer device may be required to hold the device or employ impromptu support structures that may not securely physically support the device. These solutions may lead to fatigue by the user and/or may increase the potential for damage to the device (e.g., the device may more easily be dropped, may be more likely to fall from a surface, may be more likely to become scratched, etc.). In this regard, the lack of viable physical support options for portable electronic devices that do not impede the portability of the devices may limit the use of portable electronic devices in certain contexts.

A number of solutions have been attempted. For example, cases, covers, or the like, that incorporate support structures have been developed for certain portable electronics devices. For example, a case may include folding panels that, when properly arranged, form a support structure for a device. However, such support structures often suffer from instability as the functionality of the support structure is often secondary to the primary use of the cover for protection of the portable device. For example, the number and/or range of positions in which the device may be supported may be limited (e.g., to a near vertical and/or near horizontal position). Furthermore, the folding of the panels of such a case often results in the case becoming permanently bent or otherwise distorted, thus leading to a reduction in utility as a protective case and a reduction in the aesthetics of the case. Additionally, such cases are often specifically designed for a single device, such that they cannot be used interchangeably with a number of devices.

Other attempted solutions also suffer from the lack of interchangeability between devices. For example, mounting devices that are contoured to the shape of a device in order to retain the device have been provided. However, as these mounting devices are often custom shaped to a particular device, the mounting devices are not interchangeable. Moreover, such devices may also be limited in the number of positions in which the device may be supported. For instance, the mounting devices may require rigid mounting to a support structure that severely limits the potential range of positions of the device.

SUMMARY

The present disclosure is directed to a mount for physically supporting an article. For example, the mount may physically support a device (e.g., a portable electronic device) such that the device may be visually or otherwise accessed without requiring a user to hold, carry, or otherwise physically support the device. Additionally, the mount may facilitate convenient and secure supportive contact of a device. The mount may also facilitate positioning of the device in a variety of positions when supported by the mount. Further still, the mount may facilitate the use of the mount interchangeably with a plurality of devices. Also, the mount may provide an aesthetically pleasing appearance. Further still, the mount may provide functions in addition to the support of a device (e.g., charging of the device, use as a lighting device, etc.).

One aspect provided herein includes a mount having a bulbous member, a carrier member, and an attachment member. The carrier member is supportably contactable with the bulbous member and the attachment member is removably attachable to the carrier member by way of magnetic interaction between the respective members. As such, a device that is operatively associable with the attachment member may be supportively engaged with the mount when the carrier member is in supportive contact with the bulbous member and the attachment member is attached to the carrier member.

The bulbous member may also be supportably engageable with a base and may comprise a convexly curved surface area. At least a portion of the convexly curved surface area may be unobstructed. The carrier member may include a first interconnect portion that comprises a concave surface area for conformal adjacent engagement with the convexly curved surface area of the bulbous member. The concave surface area may also be supportably contactable with the convexly curved surface area of the bulbous member. The concave surface area may be selectively positionable with respect to the convexly curved surface area throughout a continuum of positions across the unobstructed portion of the convexly shaped surface area.

The carrier member may also include a second interconnect portion. The attachment member may be removably attachable with the second interconnect portion of the carrier. Additionally, the attachment member may be operatively associable with the device. For example, the attachment member may be attached directly to a device, attached to a cover engaged with the device, integrated in the device, integrated in a cover engaged with the device, or otherwise associated with the device for supportive engagement of the device. The device may therefore be supportably engageable with the second interconnect portion upon the removable attachment of the attachment member with the second interconnect portion of the carrier member.

The bulbous member, carrier member and attachment member may interact by way of magnetic interaction of respective magnetic portions of the members. In this regard, the bulbous member, the carrier member and the attachment member may each comprise a magnetic portion, and at least one of the magnetic portions may comprise at least one magnet. The others of the magnetic portions may be magnetically attracted to one or more magnets. In this regard, the magnetic interaction between respective ones of the magnetic portions may be operable to selectively establish the supportive contact between the convexly curved surface area as well as the concave surface area and the removable attachment of the attachment member to the second interconnect portion. In an embodiment, a plurality of magnets may be provided. The plurality of magnets may provide different perspective magnetic properties between different ones of the portions of the members. In this regard, the plurality of magnets may be selected to provide desired magnetic interaction between different ones of portions of members.

Another aspect presented herein includes a method for supportably mounting a device. The method may include attaching a first interconnect portion of a carrier member in supportive contact with a convexly curved surface area of the bulbous member. The first interconnect portion may comprise a concave surface area for conformal adjacent engagement with the convexly curved surface area. The method may also include positioning the concave surface area with respect to the convexly shaped surface area within a continuum of positions across the unobstructed portion of the convexly curved surface area. The method may further include connecting an attachment member to a second interconnect portion of the carrier member. The attachment member may be operatively associable with the device for support of the device upon the connecting the attachment member to the second interconnect portion. The method may further include supporting the device with respect to the bulbous member in response to the connecting. The device may be selectively removable from the carrier by selective disengagement of the attachment member from the second interconnect portion. Additionally, the bulbous member, the carrier member and the attachment member may each comprise a magnetic portion. At least one of the magnetic portions may comprise at least one magnet and the attaching, connecting and supporting may be in response to the magnetic interaction between the respective ones of the magnetic portions.

A number of feature refinements and additional features are applicable to the aspects presented herein. These feature refinements and additional features may be used individually or in any combination. As such, each of the following features that will be discussed may be, but are not required to be, used with any other feature or combination of features of the aspects presented herein.

In an embodiment, the magnetic portion of the carrier member may comprise the magnet. In turn, the magnetic portions of the bulbous member and attachment member may comprise magnetically interactive portions that are attractable to the magnet. Furthermore, the carrier member may comprise a plurality of magnets. In this regard, different ones of the plurality of magnets may be provided adjacent to a first interconnect portion and a second interconnect portion such that different magnetic properties are provided at each of the first interconnect portion and the second interconnect portion. For example, different relative strengths of magnetic fields may be provided at the first interconnect portion and the second interconnect portion. Furthermore, the magnetic field at the second interconnect portion may provide repeatable positioning registration of the attachment member with respect to the second interconnect portion.

In this regard, the carrier member may have a first end portion and a second end portion. The first interconnect portion may be disposed on the first end portion of the carrier member and the second interconnect portion may be disposed on the second end portion of the carrier member. The first end portion and second end portion may be disposed on opposite ends of the carrier member. In this regard, when the first interconnect portion is in supportive contact with the bulbous member, the second interconnect portion may be disposed radially away from the convexly curved surface area of the bulbous member. In the embodiment described above where the carrier member comprises at least one magnet, the at least one magnet may be disposed at least partially between the first end portion and the second end portion.

The concave surface area may remain stationary with respect to the convexly curved surface area upon attachment of the attachment member and the second interconnect portion when the concave surface area of the carrier member is in supportive contact with the convexly curved surface area of the bulbous member. The concave surface area may provide conformal surface to surface contact between the concave surface area and the convexly curved surface area across substantially all the concave surface area. For example, the magnetic interaction between the magnetic portions of the bulbous member of the carrier member may maintain the concave surface area stationary with respect to the convexly curved surface area (e.g. even when supporting the weight of a device). In this regard, an external force acting on the carrier member may be required to move the carrier member throughout the continuum of positions of the convexly curved surface area.

In an embodiment, the convexly curved surface area comprises an at least partially spherical surface. For example, the bulbous member may be substantially spherical and the unobstructed portion of the convexly curved surface area may comprise at least a majority of the at least partially spherical surface.

In an embodiment, the second interconnect portion may be substantially planar. The attachment member may include a correspondingly planar surface. For example, the attachment member may comprise an annular disk. The attachment member may be associable with the device in any of a number of respects. For example, the attachment member may be operatively attached to a cover engageable with the device. Alternatively, the attachment member may be adhered, mechanically attached, welded, braised or otherwise attached to the device. Further still, as stated above the device may comprise an integrated attachment member.

In an embodiment, the force required to remove the attachment member from the carrier member is less than the force required to remove the carrier member from the bulbous member. As such, when a user attempts to remove the device from the mount, the attachment member associated with the device may detach from the carrier member prior to the carrier member being removed from the bulbous member. As such, the carrier member may remain on the bulbous member when the device is removed.

In an embodiment, the strength of the magnetic field with at second interconnect portion is less than the strength of the magnetic field at the first interconnect portion. As such, the above characteristic that the attachment member is removed from the carrier member with less force than is required to remove the carrier member from the bulbous member may be facilitated. As stated above, the different relative strengths of the magnetic field at the first interconnect portion and the second interconnect portion may be facilitated by different magnets provided in the carrier member.

In an embodiment, the static coefficient friction between the attachment member and the carrier member is greater than the static coefficient of friction between the carrier member and the bulbous member. In this regard, upon application of a force to a device supportably engaged with the mount that is tangential to the convexly curved surface area, the carrier member may be slideably disposed with respect to the bulbous member prior to the attachment member slides with respect to the carrier member. In this regard, as a user attempts to reposition a device throughout the continuum of positions, the device, the attachment member, and carrier member may be moved with respect to the bulbous member prior to the attachment member sliding with respect to the carrier member.

In an embodiment, the supportive contact of the concave surface area with respect to the convexly curved surface area is established only by the magnetic interaction between the carrier member and the bulbous member. In yet another embodiment, a plurality of attachment members are provided that are operatively associable with a corresponding plurality of the devices. The plurality of devices may be interchangeably retained by the mount by magnetic interaction with a respective to one of the plurality of attachment member in the second interconnect portion.

In an implementation, the device may be charged when supportably engaged by the mount. For example, the mount may include an inductive or conductive charging device that may interact with the device when supported by the mounting device to charge the device. Accordingly, the inductive charging of the device may continue as the device is positioned in any of a number of positions with respect to the mount because the charging may not rely on physical connection between the device and conductors to charge the device. As such, charging may continue during the positioning of the device with respect to the mount.

Additionally, the attachment member in carrier member may be provided with corresponding features to facilitate establishment of conductive electric communication between the carrier member in the attachment member. In this regard, power may be supplied to the carrier member in a number of different manners. For example, an inductive power transfer to the carrier member may be established. This may include, for example, providing a first induction member within a hollow portion of the bulbous member that is operable to provide power to a second induction member disposed in the carrier member. The first induction member in the second induction member may be maintained in adjacent relation by way of magnetic interaction between the first induction member and the second induction member. The magnetic interaction between the first induction member and the second induction member may also provide a magnetic clamping force to maintain the first interconnect portion of the carrier member in contact with the convexly shaped surface area of the bulbous member.

In an embodiment, the carrier member may be operable to receive power via a conductive path. For example, a tether may extend from a portion of the mount to the carrier member to establish conductive electrical communication for providing a conductive path for power to the carrier member. The tether may also physically secure the carrier member relative to the mount. For example, the tether may be armored or otherwise reinforced to prevent the carrier member from being removed from the mount. Furthermore, the tether may attach to the mount via a slip ring that maintains electrical communication between the tether in the mount through a range of movement of the tether with respect to the mount (e.g., including a full rotation of the tether about the mount).

In any regard, power received at carrier member may be conduct of a transfer to the attachment member when the attachment member is selectively attached to the carrier member. In this regard, the tetra member may include at least one electrically conductive portion. The at least one electrically conductive portion may be disposed for corresponding relation with an electrical connector disposed on the carrier member. This regard, when the attachment member is operatively associated with the carrier member (e.g., by way of magnetic interaction there between) the electrically conductive portion may establish electoral medication with the electrical connector to facilitate electrical communication between the carrier member the attachment member.

The attachment member may be electrical communication with electrically conductive path that may extend to a port in the device. This regard, the port may facilitate charging a device. Accordingly, when electrical communication is established between the attachment member and the carrier member, power may be provided to the port. It may be appreciated that different devices may include different port configurations and/or relative locations of the port on the device. Accordingly, the electrically conductive path may include a connector corresponding to an appropriate port of a device. In this regard, various different embodiments of attachment member and electrically conductive paths and provided such that the connector of the electrically conductive path may correspond to a particular port of a device. In this regard, embodiments of apparatuses including attachment member, electrically conductive path, and connector and provided the different corresponding devices. As such, different port locations and/or configurations may be accommodated by different embodiments of apparatuses. Furthermore, the various components the apparatus may be integrated to case or the like that may be engaged with a device. In this regard upon engagement of the case with a device, the connector may provided in communication with the port such that the electrically conductive path to provide electrical communication between the attachment member and the port.

Numerous additional features and advantages of the present invention will become apparent to those skilled in the art upon consideration of the embodiment descriptions provided hereinbelow.

DETAILED DESCRIPTION

Figure 1A:
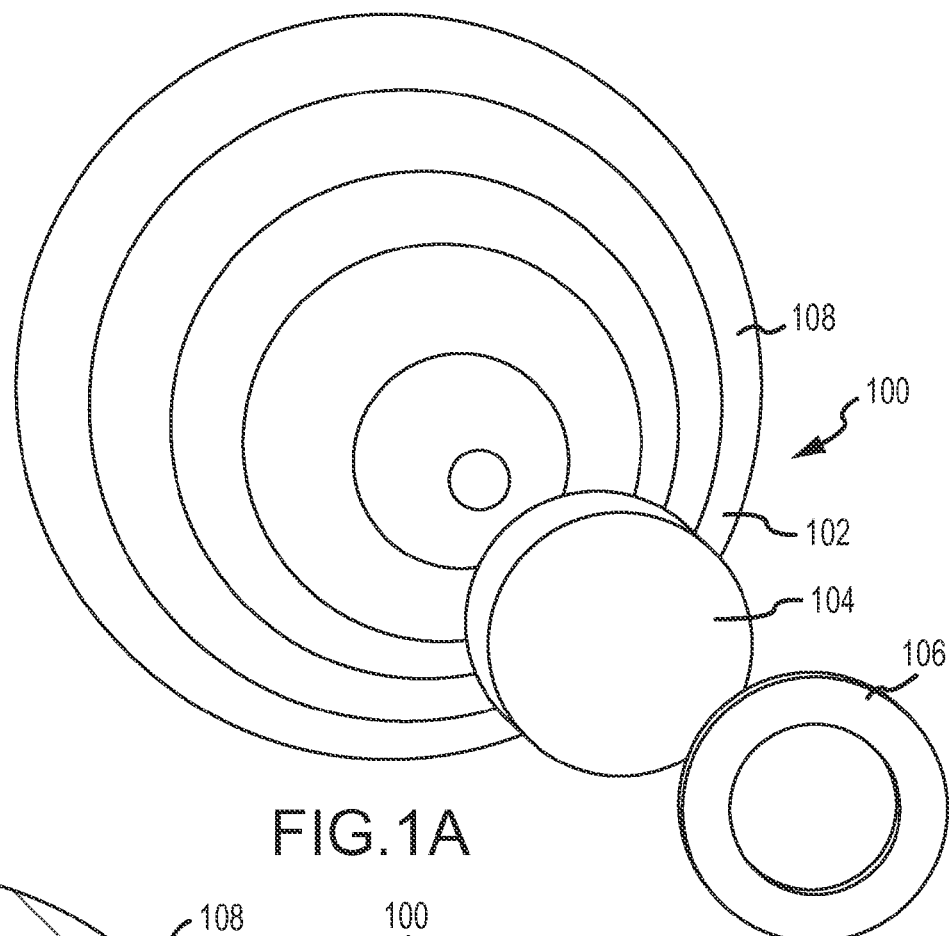
FIG. 1A is a perspective view of an embodiment of a mount system in an unconnected state.
Figure 1B:
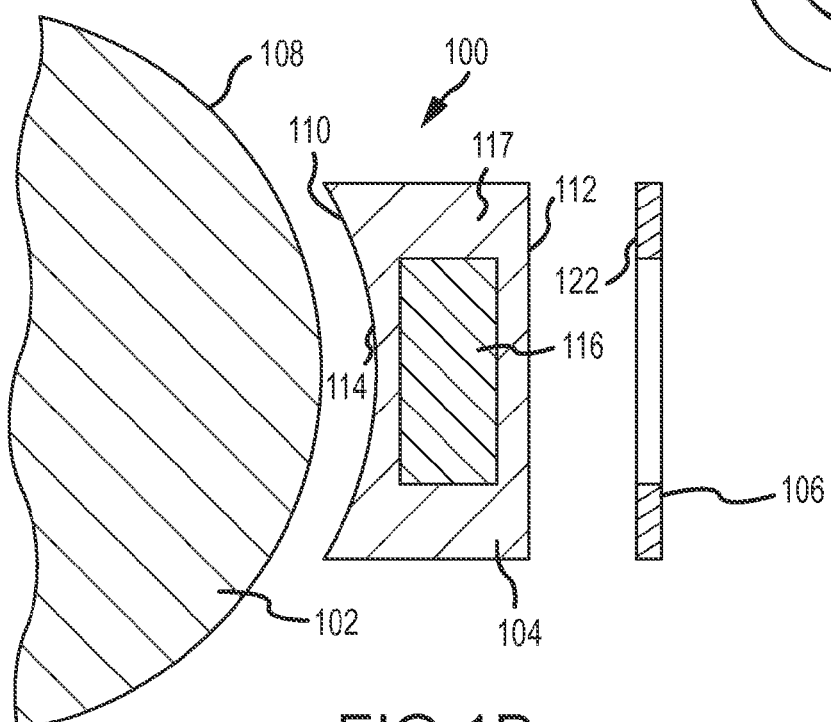
FIG. 1B is a cross sectional view of the embodiment shown in FIG. 1A.
Figure 2A:
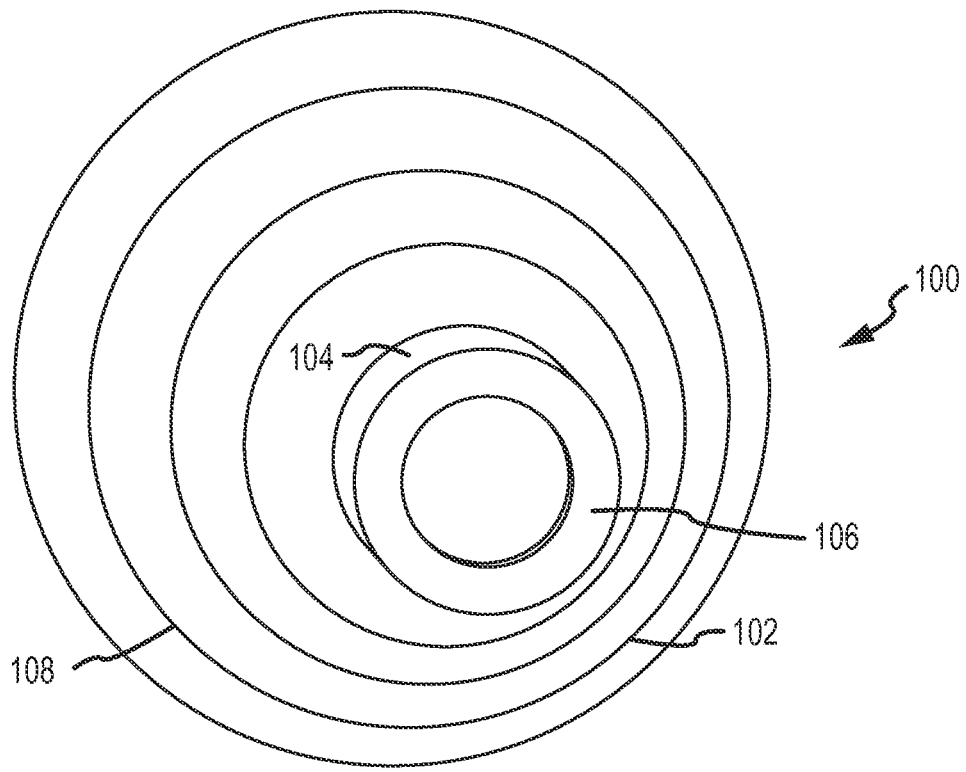
FIG. 2A is a perspective view of the embodiment of FIG. 1A in a connected state.
Figure 2B:
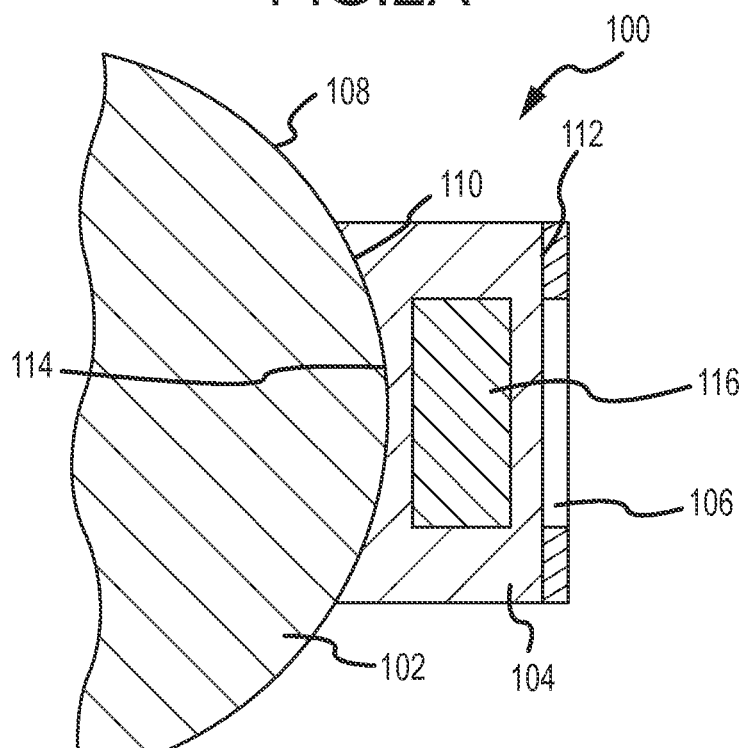
FIG. 2B is a cross sectional view of the embodiment shown in FIG. 2A.

The following description is not intended to limit the invention to the form disclosed herein. Consequently, variations and modifications commiserate with the following teachings, skill, and other knowledge of the relevant art, are within the scope of the present invention. The embodiments described herein are further intended to explain modes known of practicing the invention and to enable others skilled in the art to utilize the invention in such, or other embodiments, and with various modifications required by the particular application(s) or use(s) of the invention.

FIGS. 1A-2B depict an embodiment of a mounting system 100. The mounting system 100 generally includes a bulbous member 102, a carrier member 104, and an attachment member 106. The attachment member 106 is operatively associable with a device to be supportably engaged by the mounting system 100. In turn, the attachment member 106 is removably attachable to the carrier member 104 and the carrier member 104 is supportably contactable with the bulbous member 102. The attachment of the carrier member 104 to the bulbous member 102 as well as the attachment member 106 to the carrier member 104 is facilitated by way of magnetic interaction between the elements. In this regard, a device may be supportably engaged by the mounting system 100.

The bulbous member 102 is supportably engageable with a base (not shown in FIGS. 1A-2B). Various embodiments for supportive engagement of the bulbous member 102 are discussed in greater detail below with reference to FIGS. 4, 6A-6D, and 12A-20B. The bulbous member 102 includes a convexly curved surface area 108. At least a portion of the convexly curved surface area 108 is unobstructed. That is, the convexly curved surface area 108 includes at least a portion that is not obstructed when the bulbous member 102 is supportably engaged with a base. As shown in FIGS. 1A-2B, the convexly curved surface area 108 may comprise at least a portion of a spherical surface. Alternative embodiments include a convexly curved surface area of any appropriate shape or contour (e.g., an ovoid or the like).

As stated above, the carrier member 104 is supportively contactable with the bulbous member 102. In this regard, the carrier member 104 includes a first interconnect potion 110 that is adapted for supportive engagement with the bulbous member 102. The first interconnect portion 110 includes a concave surface area 114 that is shaped for conformal adjacent engagement with the convexly curved surface area 108. The concave surface area 114 of the first interconnect portion 110 is also adapted for selective positioning through a continuum of positions defined on the convexly curved surface area 108. For example, the first interconnect portion 110 may be positioned throughout the unobstructed portion of the convexly curved surface area 108.

The concave surface area 114 may, for example, be adapted for conformal surface to surface contact across substantially all of the concave surface area 114. As such, the radius of curvature of the concave surface area 114 may be substantially the same as the radius of curvature of the convexly curved surface area 108 along at least a portion of the convexly curved surface area 108. In this regard, when the carrier member 104 is in supportive contact with the bulbous member 102, substantially all of the concave surface area 114 may be in surface to surface contact with a portion of the convexly curved surface area 108. Alternatively, at least a portion of the first interconnect portion 110 such as a portion of the convexly curved surface area 108 may be in conforming contact with the convexly curved surface area 108. For example, a rim portion of the carrier member 104 may contact the convexly curved surface area 108.

The carrier member 104 also includes a second interconnect portion 112. The second interconnect portion 112 is adapted for contact with the attachment member 106 to facilitate the removable attachment of the attachment member 106 to the carrier member 104. The first interconnect portion 110 and the second interconnect portion 112 may be disposed on opposite end portions of the carrier member 104. As such, when the first interconnect portion 110 is supportively engaged with the bulbous member 102, the second interconnect portion 112 may face radially outward from the convexly curved surface area 108.

In an embodiment, the second interconnect portion 112 may be substantially planer. In this regard, the attachment member 106 may include a corresponding planar surface 122 for contact with the second interconnect portion 102. In the embodiments depicted in FIGS. 1A-2B, the attachment member 106 may comprise an annular disk. In additional embodiments, the attachment member 106 may take additional forms (e.g., a solid circular disk, a polygon shape, etc.). The attachment member 106 may be of a shape corresponding to the shape of the second interconnect portion 112. Alternatively, the attachment member 106 may have a shape different than that of the second interconnect portion 112. For example, at least a portion of the attachment member 106 may overhang (i.e., extend beyond) the second interconnect portion 112 or at least a portion of the second interconnect portion 112 may overhang (i.e., extend beyond) the attachment member 106 when the carrier member 104 is in contact with the attachment member 106.

As stated above, the attachment member 106 is operatively associable with a device or other object that is to be supportively engaged by the mounting system 100. The attachment member 106 may be associated with (e.g., attached to), the device in any manner known in the art. For example, the attachment member 106 may be integrated with the device, associated with a cover attachable to a device, bonded to a device (e.g., by way of adhesives or the like), or otherwise associated with the device. In any regard, the attachment member 106 is capable of supporting the device when the attachment member 106 is attached to the carrier member 104. In this regard, when the attachment member 106 is attached to the second interconnect portion 112 of the carrier member 104, the device with which the attachment member 106 is associated may be supported.

Furthermore, in various embodiments, any one of a number of different articles may be supported by the mounting system 100 that may include any of a number of different devices (e.g., electronic devices) associable with an attachment member 106 that are, in turn, supportable by the mount system 100. For example, the device may comprise a portable electronic device such as a cellular phone (e.g., a smartphone), a tablet device, a GPS device, an e-book reader, a laptop (e.g., a netbook or the like), or other electronics device. Additionally, an article supported by the mount system 100 may be a non-electronic device or article such as a photo, poster, piece of art, or other appropriate article to be physically supported.

Additionally, it will be noted that multiple attachment members 106 may be provided with respective ones of a plurality of different devices. In this regard, the attachment members 106 for each device may be operative to be removably connected to the carrier member 104. As such, the bulbous member 102 and carrier member 104 may be used in conjunction with one of the attachment members 106 and devices such that the various devices that are associated with an attachment member 106 may be interchangeably attached to the carrier member 104.

As mentioned above, the supportive contact between the bulbous member 102 and the carrier member 104 as well as the removable contact between the carrier member 104 and the attachment member 106 may be provided by way of magnetic interaction between respective magnetic portions of the bulbous member 102, carrier member 104, and attachment member 106. The magnetic portions of the bulbous member 102, the carrier member 104, and the attachment member 106 may be discrete portions provided on each of the members, or may comprise substantially the entire element (e.g., the element may be made from a magnetically interactive material such as a ferromagnetic material). One or more of the magnetic portions of the bulbous member 102, carrier member 104, and attachment member 106 may comprise at least one magnet. The others of the magnetic portions of the bulbous member 102, carrier member 104, and attachment member 106 may be magnetically interactive such that they are attracted to the at least one magnet. In this regard, magnetic interaction between respective ones of the magnetic portions may establish the supportive contact between the bulbous member 102 and the carrier member 104 as well as the removable attachment between the carrier member 104 and the attachment member 106.

In the embodiment depicted in FIGS. 1A-2B, the carrier member 104 includes a magnet 116. The magnet 116 may be disposed generally between the first interconnect portion 110 and the second interconnect portion 112. For example, an over-molded enclosure 117 may be formed about the magnet 116 to define the features of the carrier member 104 discussed above (e.g., the first interconnect portion 110, the second interconnect portion 112, etc.). The carrier member 104 may be of a one piece construction or comprise multiple pieces. For example, the carrier member 104 may consist essentially of a magnet 116 and include the structural features of the carrier member 104 described above. In an implementation, the enclosure 117 may be provided about the magnet 116 such that the enclosure 117 defines one or more of the structural features of the carrier member 104 described above. In any regard, the magnet 116 may be operative to produce a magnetic field at both the first interconnect portion 110 and the second interconnect portion 112. The bulbous member 102 and the attachment member 106 may be constructed from or include a magnetically interactive material. As such, the bulbous member 102 may be magnetically attracted to the first interconnect portion 110 and the attachment member 106 may be attracted to the second interconnect portion 112. In this regard, the magnet 116 may interact with the bulbous member 102 to establish the supportive contact between the bulbous member 102 and the carrier member 104. Additionally, the magnet 116 may establish the removable attachment of the attachment member 106 with the carrier member 104 by way of magnetic interaction between the magnet 116 and the attachment member 106.

Figure 3:
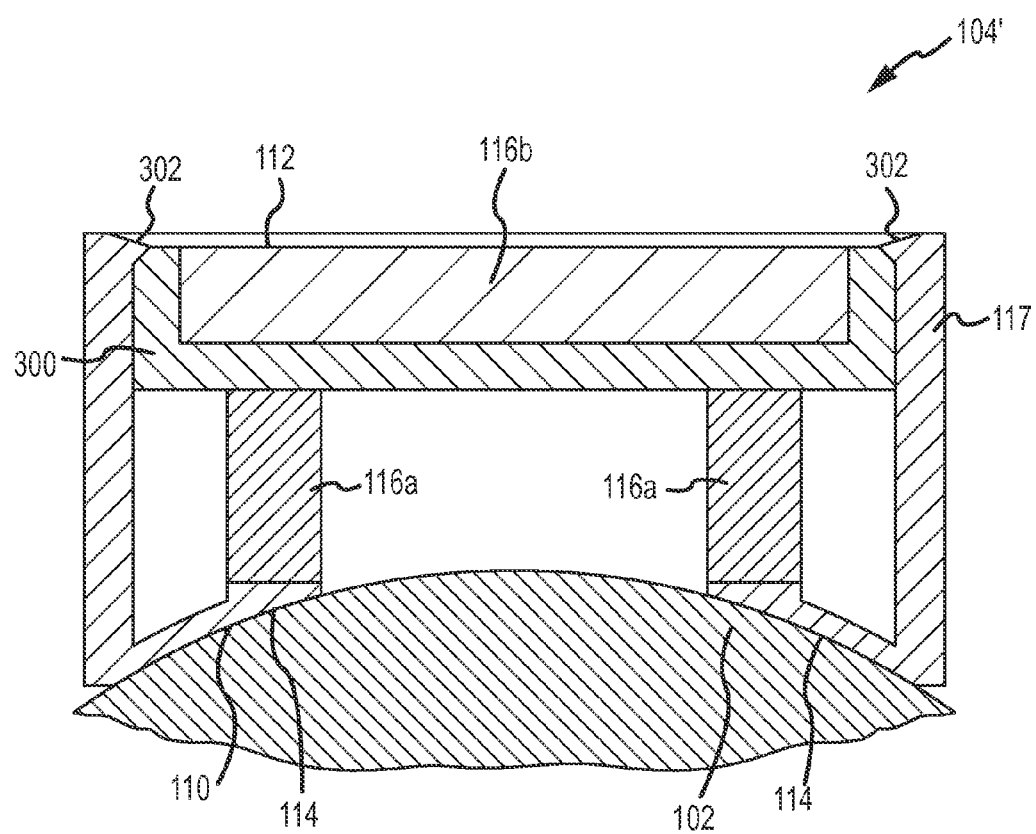
FIG. 3 is a cross sectional view of an embodiment of a carrier member.

Turning to FIG. 3, another embodiment of the carrier member 104' is shown. This additional embodiment may include any or all of the foregoing features and characteristics described above with respect to the mounting system 100. Accordingly, common elements are shown and described with common reference numerals as those used above with respect to the discussion of the mounting system 100 shown in FIGS. 1A-2B. Common elements between the various embodiments that may differ in at least some respect may be shown with a "single prime" designation. However, even those elements shown with a "single prime" may generally incorporate the features or characteristics described above.

The carrier member 104' may include a first interconnect portion 110 and a second interconnect portion 112 similar to that described above with respect to carrier member 104. The carrier member 104' may include a first magnet 116a positioned adjacent to first interconnect portion 110 and a second magnet 116b positioned adjacent to the second interconnect portion 112. In this regard, the first magnet 116a may be particularly suited for establishing magnetic interaction with the bulbous member 102. The second magnet 116b may be particularly suited for establishing magnetic interaction with the attachment member 106. For example, the first magnet 116a and the second magnet 116b may have different magnetic field strengths, different magnetic field shapes, be spaced different distances from a respective interconnect portion for each magnet, or otherwise have different characteristics or properties to facilitate different magnetic interaction between the carrier member 104' and the bulbous member 102 and the carrier member 104' and the attachment member 106, respectively.

In an implementation, the first magnet 116a may be a ring magnet comprising a rare earth metal magnet such as a neodymium magnet. The second magnet 116b may be a disk magnet. The first magnet 116a may have a larger relative magnetic field than the second magnet 116b. In turn, the second magnet 116b may have a lesser strength, more concentrated magnetic field. As such, the magnetic field of the second magnet 116b may result in a centering effect when the attachment member 106 is attached thereto. That is, the magnetic field of the second magnet 116b may provide repeatable positional registration between the attachment member 106 and the carrier member 104'. In an embodiment, the magnetic field of the second magnet 116b may be provided such that when attached to the attachment member 106, repeatable, centered engagement of the attachment member 106 with respect to the carrier member 104'.

The carrier member 104' may include an enclosure 117 that supports the first magnet 116a and second magnet 116b. For example, the chassis member may comprise an overmolded portion that encompasses the first magnet 116a and second magnet 116b. The second magnet 116b may be disposed in a cup 300 about which the enclosure 117 may extend to secure the second magnet 116b with respect to the cup 300. The cup 300 may assist in shaping the magnetic field of the second magnet 116b to assist in providing repeatable positionable registration of the attachment member 106 and the carrier member 104'. The enclosure 117 may also define structural features of the carrier member 104' such as, for example, a concave surface area 114 as described above. The enclosure 117 may also define a rim 302 about the second interconnect portion 112. The rim 302 may be beveled to assist in locating the attachment member 106 relative to the carrier member 104'.

The mount systems 100 and/or 100' may exhibit one or more characteristics during use. As discussed above, the magnetic interaction between the bulbous member 102 and the carrier member 104 may result in the supportive contact of the carrier member 104 with the bulbous member 102. The carrier member 104 may remain substantially stationary with respect to the carrier member 104 by way of the magnetic interaction between the carrier member 104 and the bulbous member 102. For example, the supportive contact between the bulbous member 102 and the carrier member 104 may be established through only the magnetic interaction therebetween. Furthermore, an external force applied to the carrier member 104 may be required to move the carrier member 104 through the continuum of positions defined on the convexly curved surface area 108 of the bulbous member 102 when in the carrier member 104 is in supportive contact with the bulbous member 102. The supportive contact between the bulbous member 102 and the carrier member 104 may be maintained when the attachment member 106 is attached to the carrier member 104. The supportive contact may be maintained even when a device is associated with the attachment member 106. That is, the device, the attachment member 106 and carrier member 104 may remain substantially stationary with respect to the bulbous member 102 when attached as described above. In this regard, the device may be supportable by the mounting system 100 such that the device does not move absent an external force acting on the device and/or carrier member 104 when supported by the mounting system 100.

For example, the interaction between the bulbous member 102 and the carrier member as described above, wherein the carrier member 104 remains stationary with respect to the bulbous member 102 absent the application of an external force may at least partially depend on the static coefficient of friction between the portion of convexly curved surface area 108 in contact with the concave surface area 114 and the force generated by way of magnetic interaction between the various elements. The static coefficient of friction may at least partially be dependent upon the material selection of the respective elements. In one embodiment, the static coefficient of friction between the bulbous member 102 and the carrier member 104 may be less than the static coefficient of friction between the carrier member 104 and the attachment member 106. Accordingly, the interaction between the carrier member 104 and the attachment member 106 may be such that upon application of a force to the attachment member 106 with a force component tangent to the convexly curved surface area 108, the carrier member 104 is moved with respect to the bulbous member 102 prior to initiating sliding of the attachment member 106 with respect to the carrier member 104. In this regard, when a device is mounted to the mounting system 100, application of force to the device with a force component tangential to the convexly curved surface area 112 results in the collective movement of the carrier member 104, attachment member 106, and device along the convexly curved surface area 112 as opposed to movement between the carrier member 104 and the attachment member 106.

Additionally, the relative strengths of the magnetic connection between the bulbous member 102 and carrier member 104 and the carrier member 104 and the attachment member 106 may be provided so that the removal of the attachment member 106 from the carrier member 104 is accomplished by a lesser force than the force required to remove the carrier member 104 from the bulbous member 102. Such relative magnetic strength may be facilitated by use of at least a first magnet 116a and a second magnet 116b as described above. In any regard, when a user attempts to remove a device from the carrier member 104 (e.g., apply an axial force tending to separate the attachment member 106 from the carrier member 104) the attachment member 106 may separate from the carrier member 104 without the separation of the carrier member 104 from the bulbous member 102.

Additionally, the relative strength of the magnetic attraction between the bulbous member 102 and the carrier member 104 and between the carrier member 104 attachment member 106 may be varied. For example, as discussed above, the strength of the magnetic attraction between the attachment member 106 and the carrier member 104 may be less than the strength of the magnetic attraction between the carrier member 104 and the bulbous member 102. The amount of force required to separate the carrier member 104 from the bulbous member 102 and/or the attachment member 106 from the carrier member 104 may at least partially be dependent upon the strength of the magnetic field at a respective one of the first interconnect portion 110 an the second interconnect portion 112. Other factors that may affect the amount of force required to separate respective elements is the distance of the element from the magnet that produces the magnetic field. Furthermore, the material selection of the bulbous member 102, carrier member 104, and attachment member 106 may affect a number of parameters including the magnetic interactivity of the respective element and the static coefficient of friction between elements. Other features and characteristics may be varied to facilitate any or all of the foregoing characteristics. For example, alternatively shaped pieces may be provided (e.g., interlocking features between the carrier member and attachment member, etc.) or other varied features may be provided to facilitate the foregoing characteristics.

In one embodiment, the interaction between respective magnetic portions of the bulbous member 102, carrier member 104, and/or attachment member 106 may be adjustable. For example, the carrier member 104 be provided with an adjustable portion. Upon adjustment of the adjustable portion of the carrier portion 104, the magnetic portion of the carrier member 104 may be adjusted relative to one or both of the first interconnect portion 110 and/or second interconnect portion 112. Accordingly, the strength of the magnetic field at the first interconnect portion 110 and/or second interconnect portion 112 may be varied by adjusting the adjustable portion. The adjustable portion may include a threaded portion of the carrier member 104 whereby movement of the threaded portion results in movement of the magnetic portion with respect to one or both of the first interconnect portion 110 or second interconnect portion 112.

Another embodiment of a mounting system 100" is depicted in FIG. 3. This additional embodiment may include any or all of the foregoing features and characteristics described above with respect to the mounting systems 100 and/or 100'. Accordingly, common elements are shown and described with common reference numerals as those used above with respect to the discussion of the mounting system 100 and 100' shown in FIGS. 1A-3. Common elements between the various embodiments that may differ in at least some respect may be shown with a "double prime" designation. However, even those elements shown with a "double prime" may generally incorporate the features or characteristics described above.

Figure 4:
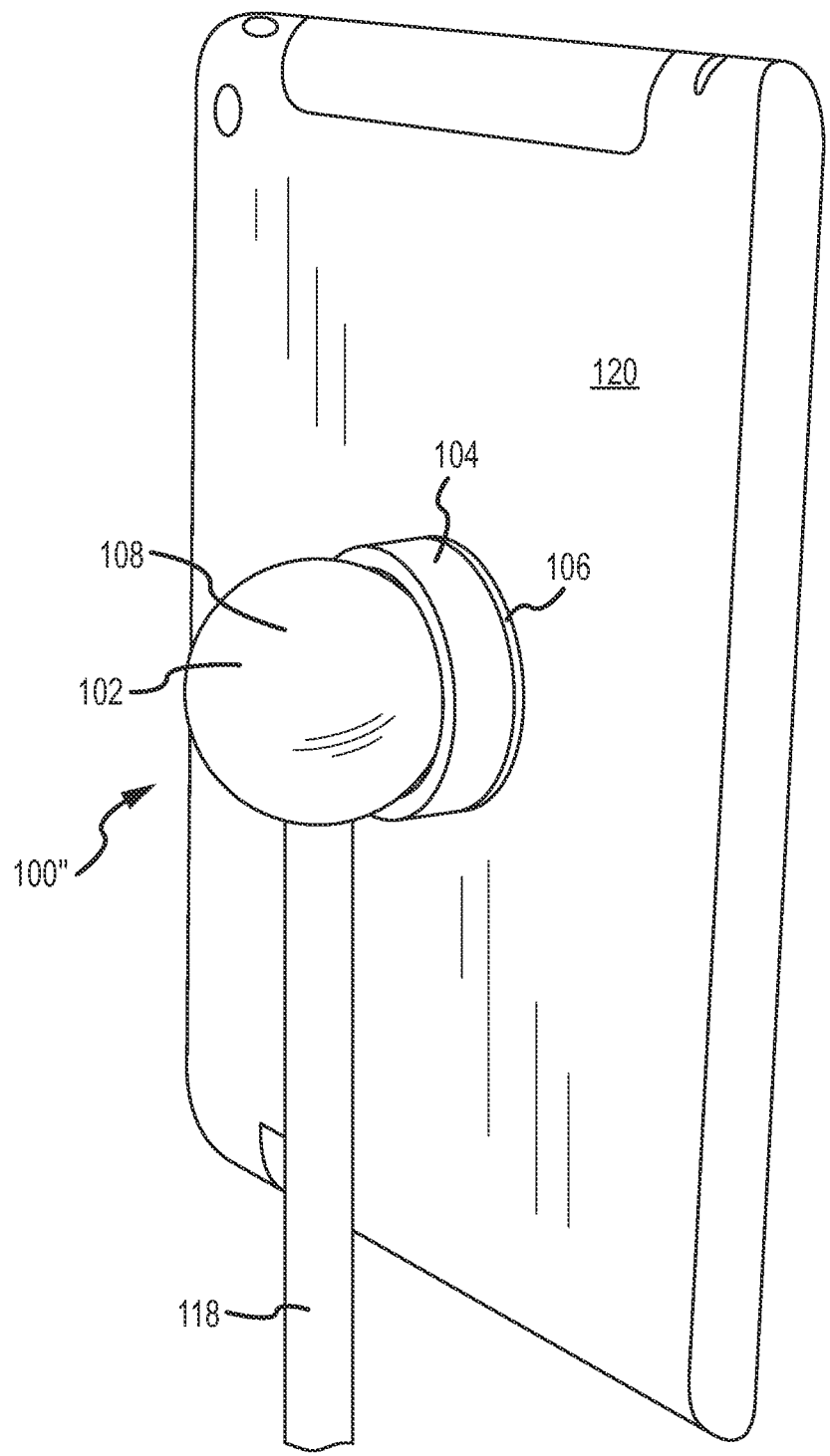
FIG. 4 perspective view of another embodiment of a mount system.

With additional reference to FIG. 4, a mounting system 100" is depicted. The mounting system 100" includes a bulbous member 102. The bulbous member 102 may be substantially spherical with the exception of the connection of a support arm 118 extending from the spherical bulbous member 102. The support arm 118 may extend from the bulbous member 102 such that the bulbous member 102 is supportably engaged with a base (not shown in FIG. 4) by way of the support arm 118. The bulbous member 102 may include a convexly curved surface area 108 that is substantially spherical with the exception of where the support arm 118 engages with the bulbous member 102. In this regard, the unobstructed portion of the convexly curved surface area 108 of the bulbous member 102 may be at least a majority of the spherical outer surface area of the sphere comprising the bulbous member 102. In one embodiment, the support arm 118 is attached to the bulbous member 102 and obstructs an area of the spherical outer surface area of the bulbous member 102 that is much smaller than that of the total spherical surface area comprising a convexly curved surface area 108. In this regard, substantially all of the spherical surface area may define the continuum of positions through which a carrier member 104 may be positioned with respect to the bulbous member 102.

Figure 5:
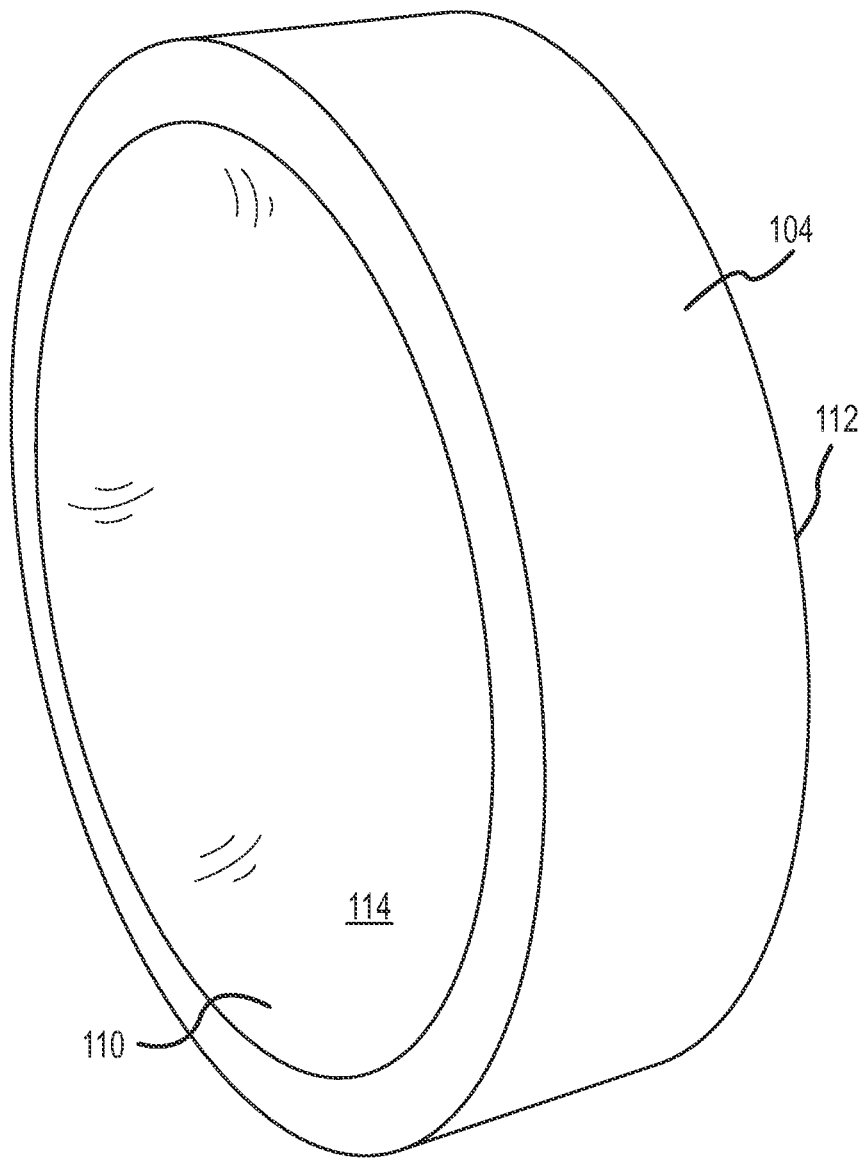
FIG. 5 is a perspective view of an embodiment of a carrier member.

The carrier member 104 of the mounting system 100" is shown in detail in FIG. 5 and may be substantially similar to carrier member 104 and/or 104' as described above with respect to FIGS. 1A-3. That is, the carrier member 104 may include a concave surface area 114 for conformal adjacent engagement with the convexly curved surface area 108. A concave surface area 114 corresponding to the first interconnect portion 110 may be disposed on a first end of the carrier member 104. On an opposite end of the carrier member 104, the second interconnect portion 112 may be adapted for interconnection with the attachment member 106 of FIG. 4.

FIG. 4 further depicts that the attachment member 106 may be operatively associated with a device 120. In this regard, the attachment member 106 may be secured to the device 120 such that when the attachment member 106 magnetically interacts with the carrier member 104, the device 120 is removably supported with the carrier member 104. Furthermore, as the carrier member 104 may magnetically interact with the bulbous member 102, and may be supportably contactable therewith, the device 120 may be mounted with the mounting system 100".

As discussed above, an external force applied to the carrier member 104 may move the carrier member 104 throughout a continuum of positions defined on the convexly curved surface area 108. In FIG. 4, as the convexly curved surface area 108 is substantially spherical, the carrier member 104 may be moved throughout a continuum of positions corresponding to the substantially all of the spherical outer surface area of the bulbous member 102. In this regard, the device 120 may be positioned and a variety of positions correspond to the different locations of the carrier member 104 with respect to the bulbous member 102 throughout the continuum of positions.

Figure 6:
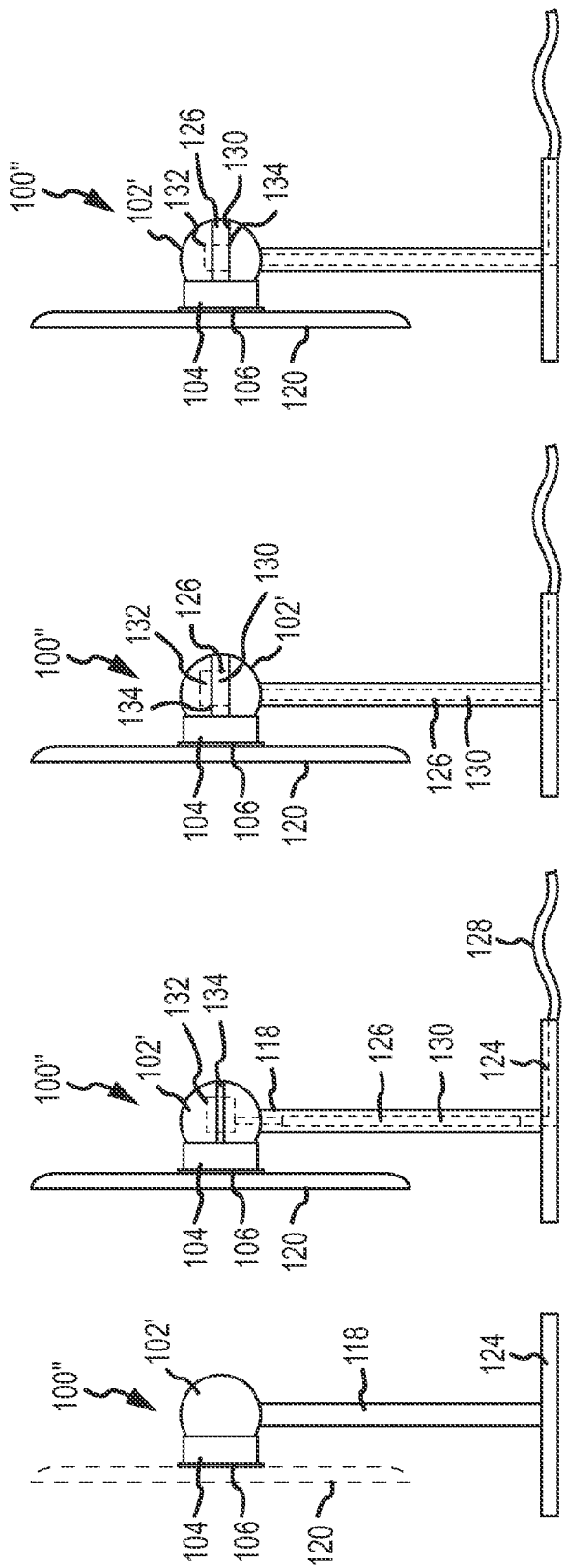
FIGS. 6A-6D depict various embodiments of a base for use with an embodiment of a mount system.

FIGS. 6A-6D depict various embodiments of a mounting system 100" as depicted in FIG. 4 including a substantially spherical bulbous member 102 along with various embodiments of support structure for supportively engaging the bulbous member 102 of the mounting system 100". For instance, FIG. 6A depicts the mounting system 100" with a support arm 118 extending to a base 124. In this regard, the base 124 may rest on a surface and support the mounting system 100". The base 124 may be of sufficient size so as to securely support the support arm 118 and mounting system 100". For example, the base 124 may be generally circular. Furthermore, the base 124 may be weighted such that the center of gravity of the base 124, support arm 118, and mounting system 100" may be near the base 124, even when a device is attached to the mounting system 100' as described above.

FIG. 6B depicts a base 124 and support arm 118 that includes a lighting device 126 disposed in the support arm 118. In this regard, the embodiment depicted in FIG. 6B may receive power from a power cable 128. The power cable 128 may supply power to the lighting device 126 disposed on the support arm 118. The support arm 118 may include an optically transmissive portion 130 (e.g., that is transparent or translucent) through which the lighting device 126 may emit light. In this regard, the embodiment depicted in FIG. 6B may, in addition to serving as a mount for a device, act as a lamp or light independent of its function as a mounting device.

Furthermore, the embodiment depicted in FIG. 6B may include an inductive charging device 132. For example, the inductive charging device 132 may be disposed in the bulbous member 102 adjacent to where the device is attachable. In this regard, when the device 120 is supportably attached with the mounting system 100", the inductive charging device 132 may be disposed sufficiently near the device 120 such that the inductive charging device 132 may interact with the device 120 and the device 120 may be charged by way of inductive charging. An inductive charging device 132 is one that supplies power to a device by way of an induction coupling between the device 120 and the inductive charging device 132. An electromagnetic field is generated at the inductive charging device 132 that interacts with an induction coil provided with the device 120 to induce an electrical current at the device 120 that is used to charge a battery at the device 120. In this regard, the device may not need to make physical contact with a powered conductor to receive charging power as is the case in conductive charging or direct coupling charging, but may instead, be disposed near the inductive charging device 132.

In this regard, the bulbous member 102 may also include a charge indicator 134. The charge indicator 134 may be in communication with the inductive charging device 132 and operative to indicate the level of charge of the device 120 being charged by the inductive charging device 132. The charge indicator 134 may include color coded lighting disposed in the bulbous member 120. For instance, the charge indicator 134 may comprise one or more multicolor LEDs that emit different colors of light through an optically transmissive portion 130 to indicate the charging status of the device 120.

Additionally, as depicted in FIG. 6C, the bulbous member 102 may include a lighting device 126 to emit light through an optically transmissive portion 130 in addition to a lighting device 126 provided in the support arm 118 that may emit light though an optically transmissive portion 130 of the support arm 118. Accordingly, the embodiment depicted in FIG. 6C may also act as a lamp or lighting device in addition to providing a support structure for the mounting system 100". For example, in the case where the embodiment depicted in FIG. 6C is disposed on a surface such as a desk, side table etc., the device may act as a lamp as well as a support structure for the mounting system 100". In the embodiment depicted in FIG. 6D, a lighting device 126 may only be provided in the bulbous member 102' such that the support arm 118 does not include any lighting devices. The bulbous member 102 of the embodiment of FIG. 6D may also include a charge indicator 134 associated with an inductive charging device 132 for charging a device 120 supported by the mounting system 100".

Figure 7:
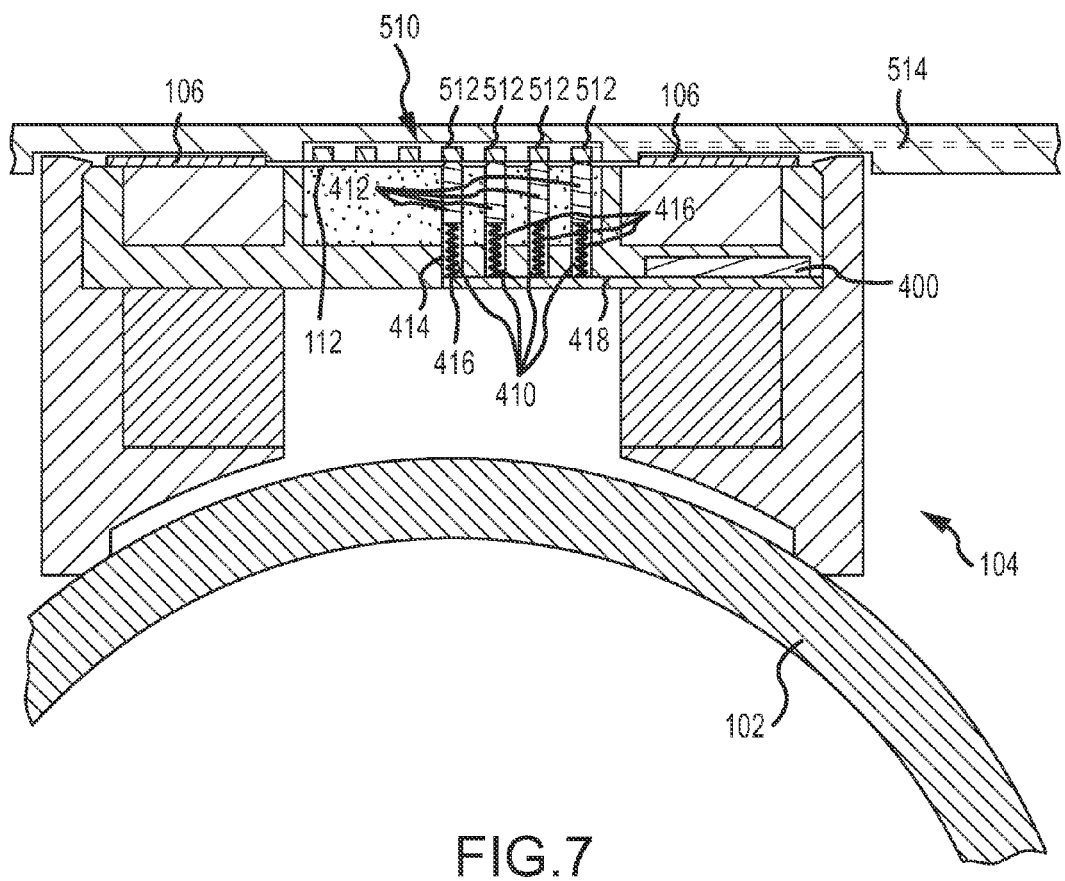
FIG. 7 is a cross sectional view of an embodiment of a carrier member that facilitates electrical coupling of a device.

While inductive charging may be provided for a device 120 supportably engaged by a mount system 100", it may be appreciated that many devices may not include the necessary hardware to facilitate inductive charging of the device 120. That is, a device 120 may not include the requisite hardware to establish an inductive couple with corresponding hardware provided with the mounting system 100. In this regard, an embodiment of the mounting system 100 may be provided for charging a device supportably engaged by a mount system 100 as described herein is depicted in FIG. 7. Power may be supplied to the device 120 by way, at least in part, of conduction such that traditional devices lacking inductive charging capabilities may also be charged or otherwise communicated with when supported by a mount system 100.

In FIG. 7, a carrier member 104 including a power conduit 400 is shown. The power conduit 400 is depicted schematically and may provide power by one of number of different methods known in the art. For example, as will be described in greater detail below, the power conduit 400 may comprise a component in an inductive charging system, receive power from an external source by way of conduction, have onboard power supplied (e.g., via a capacitor, battery, or the like), or otherwise be operable to supply power. In this regard, the power conduit 400 may include a power supply for generation of power at the carrier member 104. However, the power conduit 400 may also simply facilitate transfer of power from a source external to the carrier member 104 as will be discussed in greater below.

In any regard, the carrier member 104 may include one or more electrical connectors 410 in operation communication with the power conduit 400. The plurality of electrical connectors 410 may be disposed relative to the second interconnect portion 112. For example, the electrical connectors 410 may at least partially extend from the second interconnect portion 112. As depicted in FIG. 7, the electrical connectors 410 may each comprise a pin 412 which may at least partially extend from the second interconnect portion 112. The pin 412 be displaceable relative to the second interconnect portion 112 when contacted (e.g., upon attachment of the attachment member 106 at the second interconnect portion 112). In this regard, the pin 412 may be retained in a bore 414 defined in the carrier member 104. A spring 416 may be disposed in the bore 414 and bias the pin 412 in the extended position relative to the second interconnect portion 112. The pin 412 may be in electrical communication with the power source 400 by way of the spring 416 and/or an electrical conductor 418 extending from the bore 414 to the power conduit 400. The spring 416 may maintain the pin 412 in contact with an attachment member 106 when connected to the carrier member 104.

Figure 8:
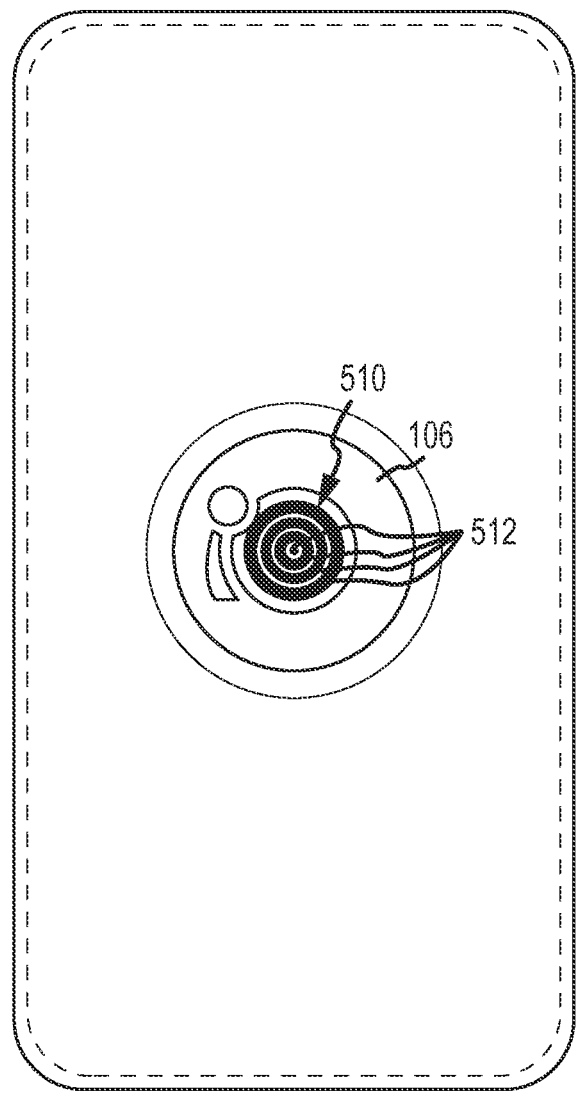
FIG. 8 is a plan view of an embodiment of an attachment member for use with the carrier member of FIG. 7 associated with a device.

In an embodiment, upon attachment of the attachment member 106 to the carrier member 104, the pins 412 of the electrical connectors 410 may contact corresponding electrical conductors 510 provided on the attachment member 106 as shown in FIG. 8, the electrical conductors 512 may include concentric rings 512. In this regard, regardless of the rotational position of the attachment member 106 relative to the carrier member 104, isolated electrical communication may be provided between respective ones of the concentric rings 512 and the electrical connectors 410. In this regard, the concentric rings 512 may be electrically isolated from one another. Upon attachment of the attachment member 106 to the carrier member 104, corresponding ones of the concentric rings 512 and pins 412 may make contact as shown in FIG. 7 to establish electrical communication between the corresponding ones of the electrical connectors 410 and electrical conductors 510. The pins 412 may be deflected in the bore 414, yet maintain contact with the electrical conductors 510 by way of a force acting on the pins 410 by the springs 416 to allow for attachment of the attachment member 106 and contact between the electrical connectors 410 and electrical conductors 510. Each of the electrical connectors 410 may be electrically isolated such that each one of the electrical connectors 410 establishes an independent electrical communication path. In this regard, selective electrical communication may be established between the attachment member 106 and the carrier member 104 when the attachment member 106 is attached to the carrier member 104 by way of the magnetic interaction between the magnetic portions of the carrier member 104 and the attachment member 106. In this regard, the registration of the electrical connectors 410 relative to the electrical conductors 510 may be maintained to establishing electrical communication between the attachment member 106 and the carrier 104. Thus, the centering and/or repeatable positional registration features of the second magnet 116b described above in FIG. 3 may provide reliable positional registration between the electrical connectors 410 and the electrical conductors 510.

Figure 9:
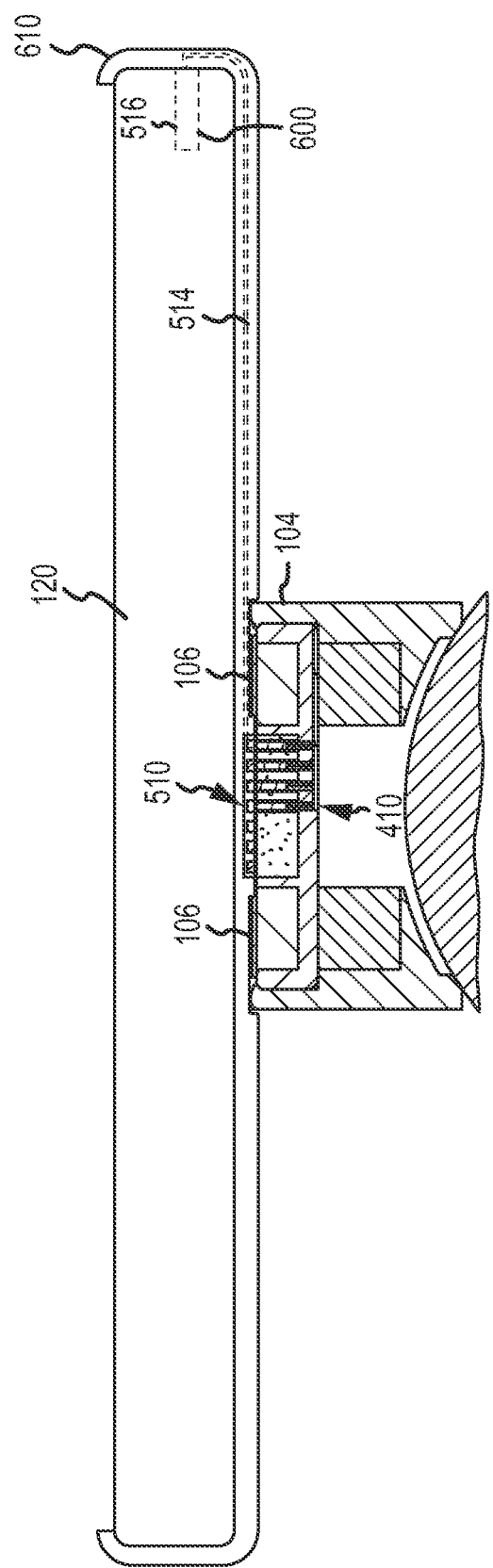
FIG. 9 is a cross sectional view of the embodiment of FIG. 7.

The electrical conductors 510 of the attachment member 106 may in turn be in electrical communication with a conductive path 514 extending from the attachment member 106. With further reference to FIG. 9, the conductive path 514 may extend from the attachment member 106 to a connector 516. The connector 516 may be engaged with a port 600 on a device 120. The port 610 may allow for charging of the device 120. For example, the port 600 may be a micro-USB port, a proprietary connector, or other connection provided for charging a device 120. The conductive path 514 may comprise any conductive material that facilitated electrical communication between the electrical conductors 510 and the connector 516. In an embodiment, the conductive path 514 may include conductive traces disposed on a substrate (e.g., a flexible substrate). The substrate of the conductive path 514 may be adhered or attached to the device 120. In this regard, the connector 516 may be maintained in the port 600 such that the attachment member 106, conductive path 514, and connector 516 are maintained with the device even upon disengagement of the attachment member 106 from the carrier member 104.

In an embodiment, the attachment member 106 and conductive path 514 may be integrated into a case 610 for the device 120. In this regard, upon engagement of the device 120 by the case 610, the connector 516 may be disposed in the port 600 of the device. As such, it may be appreciated that distinct cases 610 may be provided for different devices 120. In this regard, particular case configurations including different connector 516 designs and/or locations may be provided for different devices 120. However, each configuration used for different devices 120 may include an attachment device 106 including the electrical conductors 510 to facilitate establishing electrical communication between the attachment member 106 and the carrier member 104 as described above.

In any regard, upon establishing contact between the electrical connectors 410 of the carrier member 104 and the electrical conductors 510 of the attachment member 106, electrical communication may be established between the power conduit 400 and the connector 516 such the power may flow from the power conduit 400 and the connector 516 such that the device 120 supportively attached to the carrier member 104 may receive power to facilitate charging and/or powering of the device 120.

Figure 10:
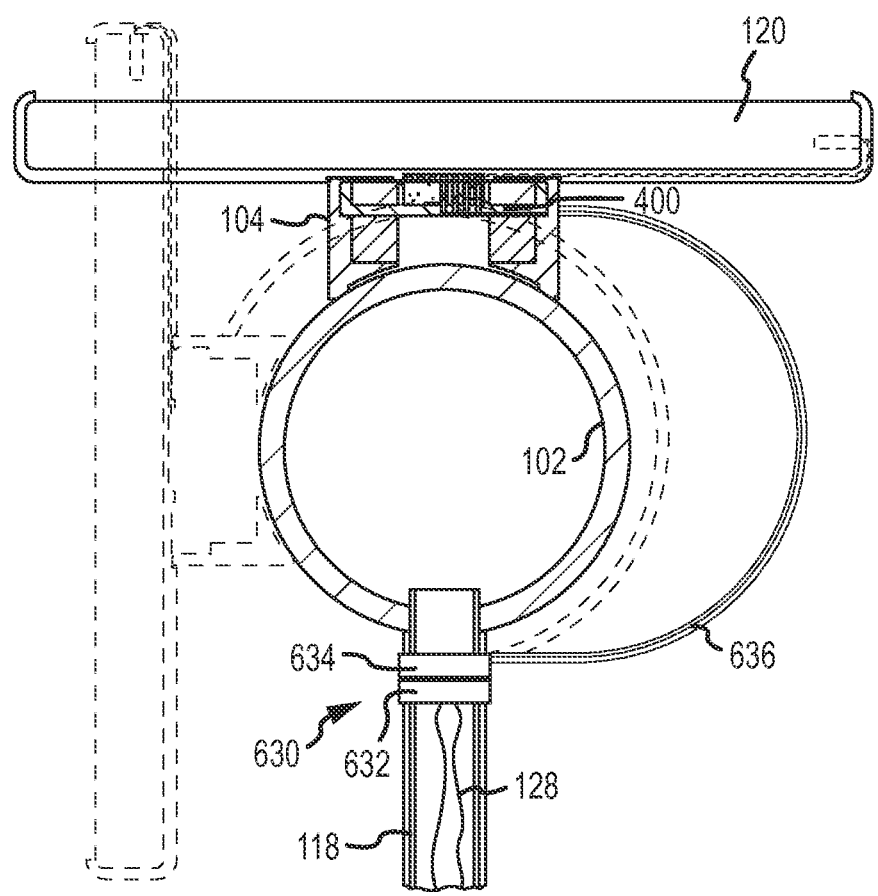
FIG. 10 is a cross sectional view of an embodiment for providing power to a carrier member.

With further reference to FIG. 10, an embodiment for providing power to the power conduit 400 is shown. In FIG. 10, a slip ring assembly 630 may be provided on the support arm 118 of the mount system 100. The slip ring assembly 630 may receive power via a power cable 128 extending through the support arm 118. As described above, the power cable 128 may in turn be connected to a plug or other external power supply. The slip ring 630 may allow for relative rotation between a first slip ring portion 632 and a second slip ring portion 634 while maintaining electrical communication between the first slip ring portion 632 and the second slip ring portion 634. The second slip ring portion 634 may have a tether 636 extending from the second slip ring portion 634. The tether 636 may include an electrical communication path. Accordingly, the tether 636 may extend from the second slip ring portion 634 to the carrier member 104 to establish conductive electrical communication with the power conduit 400 in the carrier member 104.

In this regard, the tether 636 may be allowed to rotate with respect to the support arm 118 such that the attached carrier 104 may in turn also rotate about the bulbous member 102. As such, the positioning of the carrier member 104 throughout a continuum of positions relative to the bulbous member 102 as described above may be maintained. Additionally, the tether 636 may be reinforced and/or armored to prevent detachment or severing of the tether 363 from either the support arm 118 or the carrier member 104. As such, when the mount system 100 is provided in an environment where theft or loss of the carrier member 104 may be likely (e.g., a public location, a school, or other communal environment), the carrier member 104 may be retained with the mount system 100 by the tether 636. Thus, in an implementation, a tether 636 may be provided without any electrical conductive path such that the tether 636 only secures the carrier member 104 to the mount system 100 without providing power to the carrier member 104

Figure 11:
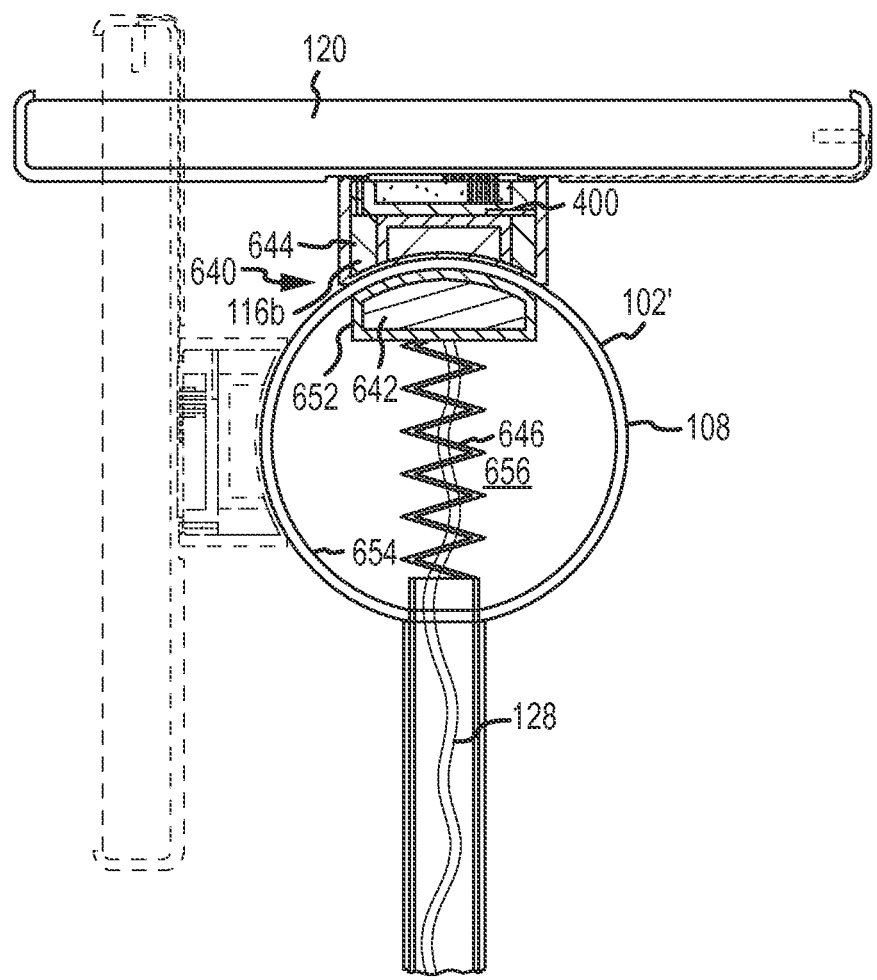
FIG. 11 is a cross sectional view of another embodiment for providing power to a carrier member.

In an application shown in FIG. 11, the power conduit 400 of the carrier member 104 may receive power via induction. For example, an inductive couple 640 may be provided comprising a first induction member 642 and a second induction member 644. The first induction member 642 may be provided within a hollow bulbous member 102'. The hollow bulbous member 102' may be made from a non-metallic material to reduce any interference with an electromagnetic field passing between the first induction member 642 and the second induction member 644. The first induction member 642 may receive power from a power cord 128 extending through a support arm 118. The first induction member 642 may also include a magnetic portion 652. The magnetic portion 652 of the first induction member 642 may be magnetically attracted to a magnetic portion of the carrier member 104 (e.g., magnet 116b). The first induction member 642 may be maintained in contact with a interior surface 654 of the bulbous member 102' by a biasing member (e.g., spring 646). In this regard, the spring 646 may allow for movement of the first induction member 642 about the interior 656 of the bulbous member 102' while maintaining the first induction member 642 against the interior surface 654 of the bulbous member 102'. In this regard, when the carrier member 104 is disposed adjacent to a convexly curved surface area 108, the first induction member 642 may be attracted to and magnetically interact with the carrier member 104. In this regard, the resultant magnetic clamping force acting on the bulbous member 102' between the first induction member 642 and the carrier member 104 may be sufficient to maintain the carrier member 104 in place relative to the bulbous member 102'. As such, the carrier member 104 may be moveable through the continuum of positions relative to the convexly curved surface area 108 as described above.

The magnetic interaction between the first induction member 642 and the carrier member 104 may also result in adjacent positioning of the first induction member 642 relative to the second induction member 644 provided with the carrier member 104. As such, the first induction member 642 and the second induction member 644 may form an inductive couple such that power may be inductively communicated from the first induction member 642 to the second induction member 644. The second induction member 644 may in turn provide power to the power conduit 400 of the carrier member 104. In this regard, the first induction member 642 and the second induction member 644 may comprise a split core transformer that is capable of transmitting power from the first induction member 642 to the second induction member 644. In this regard, the first induction member 642 may include first induction coil and the second induction member 644 may include a second induction coil. Upon passing electrical current through the first induction coil, an electromagnetic field may be generated that may extend to the second induction coil. The interaction of the electromagnetic field generated by the first induction coil may result in electoral current being established in the second induction coil. As such, lexical power may be transmitted from the first induction member 642 to the second induction member 644 through some space. In this regard, even in the instance where a sidewall of bulbous member 102' passes between the first induction member 642 in the second induction member 644, electoral power may still be transmitted between the two.

While the foregoing examples have focused on provision of power to a device supportively mounted to a mounting system 100, it will be appreciated that additional communication paths may be provided to facilitate electrical communication with the device as well. For example, one or more data channels may be established between the mounting system 100 and a device.

Figure 12A:
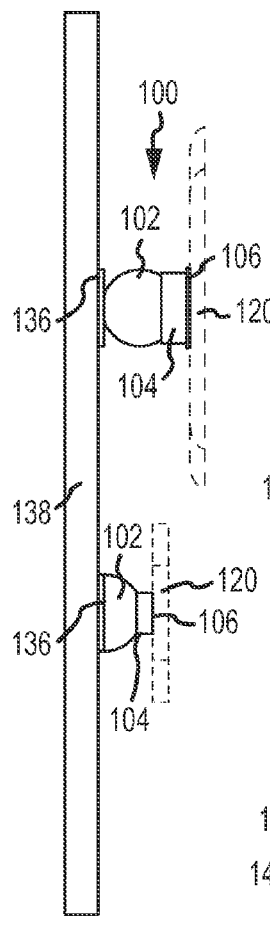
FIGS. 12A-12C depict various embodiments of support structures for an embodiment of a mount system.
Figure 12B:
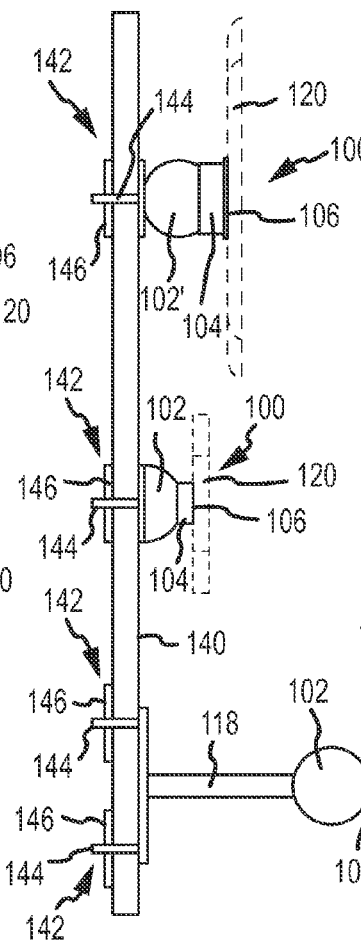
Figure 12C:
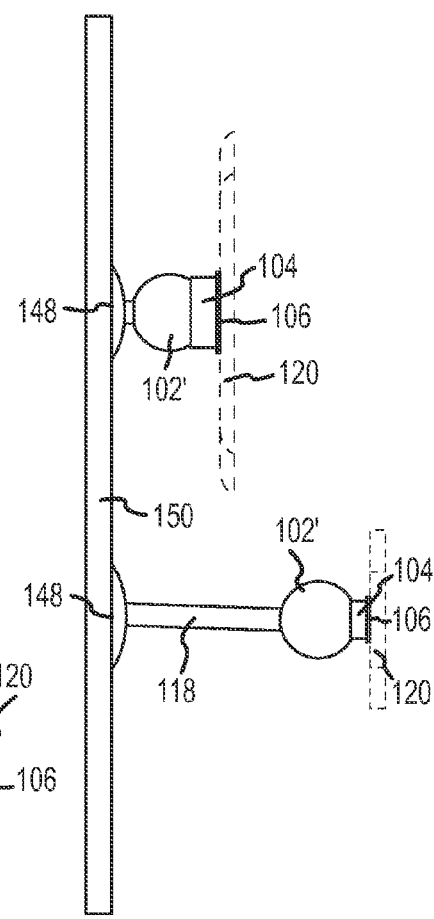

Turning to FIGS. 12A-12C, various additional embodiments of support structures for use with a mounting system (e.g., mounting system 100 or 100' discussed above) are shown. For example, as depicted in FIG. 12A, the bulbous member 102 may be in supportive contact with a support magnet 136 for magnetic interaction with a magnetically interactive substrate 138. In this regard, the support magnet 136 to which the bulbous member 102 is attached may have sufficient strength to connect to the magnetically interactive substrate 138 to support the mounting system 100. Also shown in FIG. 12A, the bulbous member 102 may comprise a portion of a sphere (e.g., a hemisphere) attached to a supportive magnet 136 that is operatively attachable to the magnetically interactive substrate 138.

FIG. 12B depicts an embodiment of support structure for a mounting system 100 for attachment of the mounting system 100 to a wall 140. In this regard, one or more wall mounting devices 142 may be supportively engaged with a bulbous member 102. The wall mounting devices 142 may include a threaded portion 144 extending through the wall 140 or other similar substrate. The threaded portion 144 may threadably engage an anchor 146. Furthermore, as shown in the bottom of FIG. 12B, a support arm 118 may extend from the bulbous member 102 and be attached to one or more wall mounting devices 142 for securing the mounting system to a wall 140.

FIG. 12C depicts an alternative embodiment of a support structure wherein a suction cup mount 148 is supportively engaged with a bulbous member 102 or support arm 118. In this regard, the suction cup mount 148 may be affixed to a smooth substrate 150 to support the mounting system.

Figure 13:
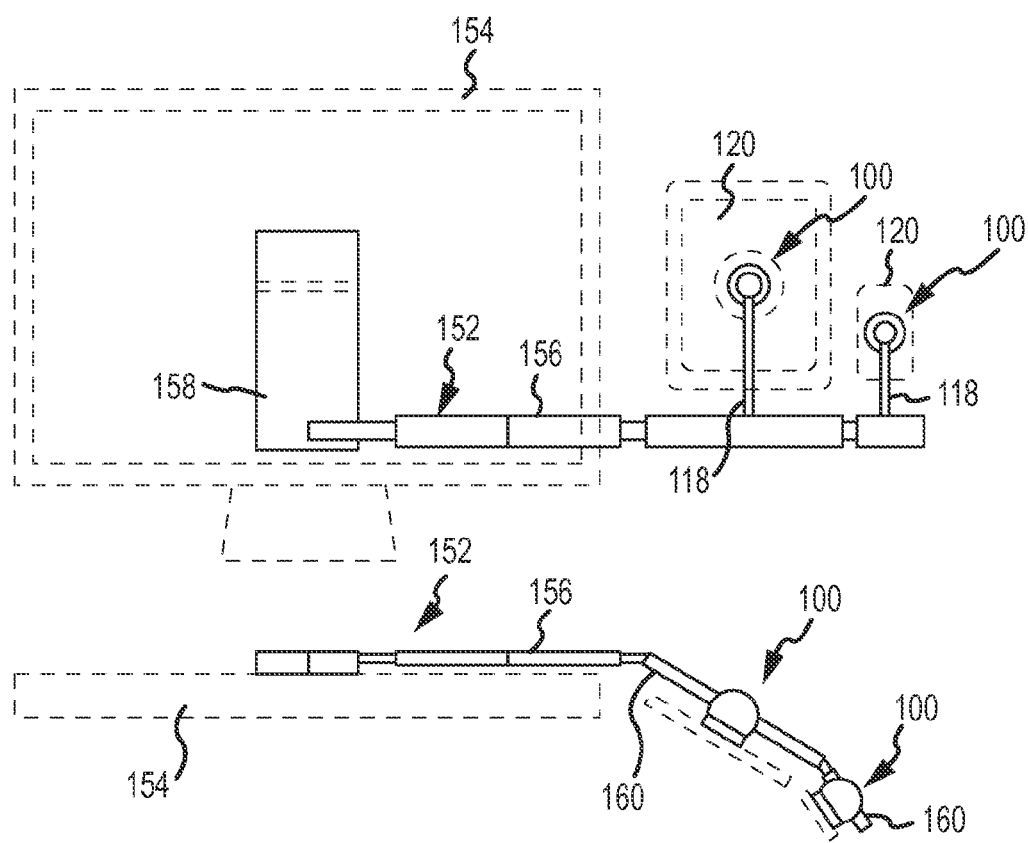
FIG. 13 depicts embodiments of a monitor mount for use with an embodiment of a mount system.

FIG. 13 shows an embodiment of a monitor mount 152 for attachment of a mounting system 100 to a monitor 154. In this regard, a monitor support arm 156 may be affixed to standard mount receptacles 158 of a monitor 154. The monitor support arm 156 may extend to a side of the monitor 154 and include attachment portions 160 for accepting a mounting system 100. For example, the mounting system 100 may be engaged with a support arm 118 connected with one of the attachment portions 160. The attachment portions 160 may be articulated such that the individual attachment portions 160 to which a mounting system is attached may move with respect to the monitor 154 and one another. As shown in FIG. 13, a number of attachment portions 160 may be provided.

Figure 14:
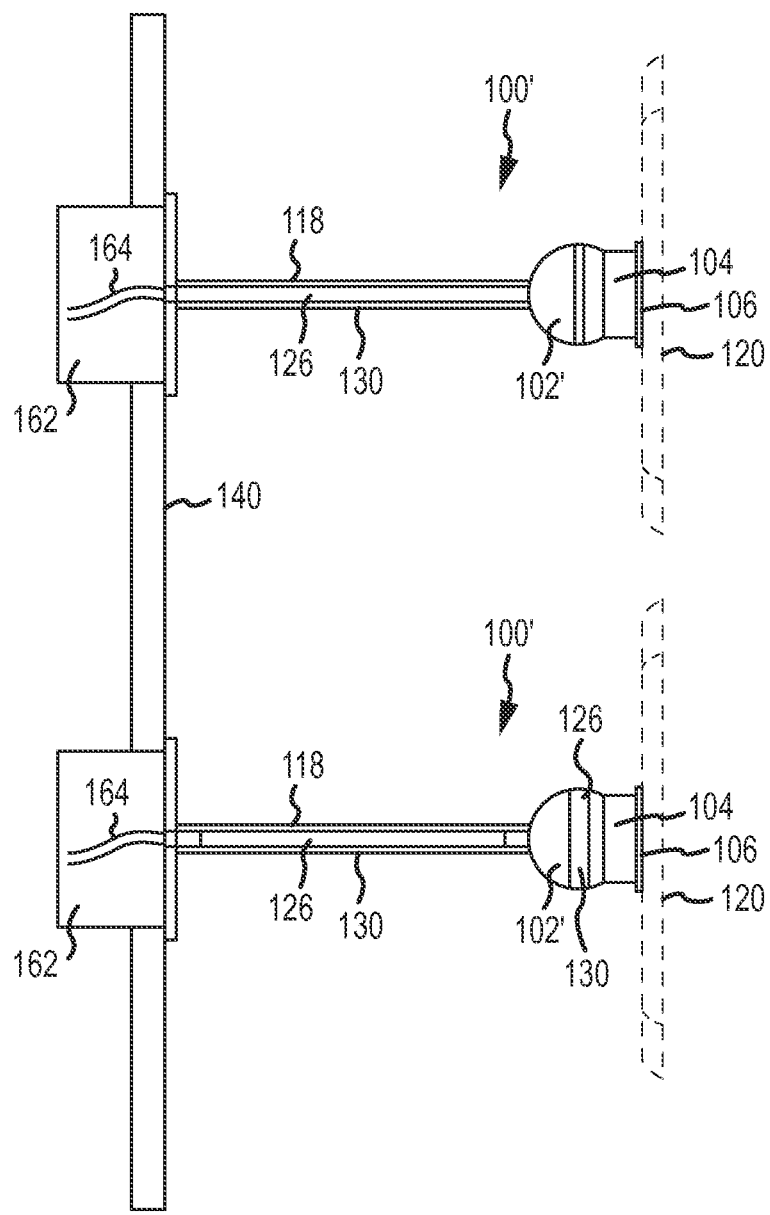
FIG. 14 depicts additional embodiments of support structures for use with an embodiment of a mount system.

FIG. 14 depicts another embodiment of a support structure for a mounting system that facilitates communication between an external power source (e.g., an electrical outlet, wiring system, etc.) and the mounting system 100. The mounting system 100 may be attachable to a junction box 162. For example, in a case where a charging element and/or a lighting element are provided in either the bulbous member 102 and/or support arm 118, power may be supplied thereto by way of standard wiring 164. The standard wiring 164 may terminate at the junction box 162. In this regard, the mounting device 100 may be supportively engageable with the junction box 162 such that the standard electrical wiring 164 may be connected to the mounting system 100 to provide power to components therein as described above. The interaction of the mounting system 100 with the junction box 162 may be by way of known techniques for securing lighting fixtures or the like to junction boxes 162 as is known in the art.

Figure 15:
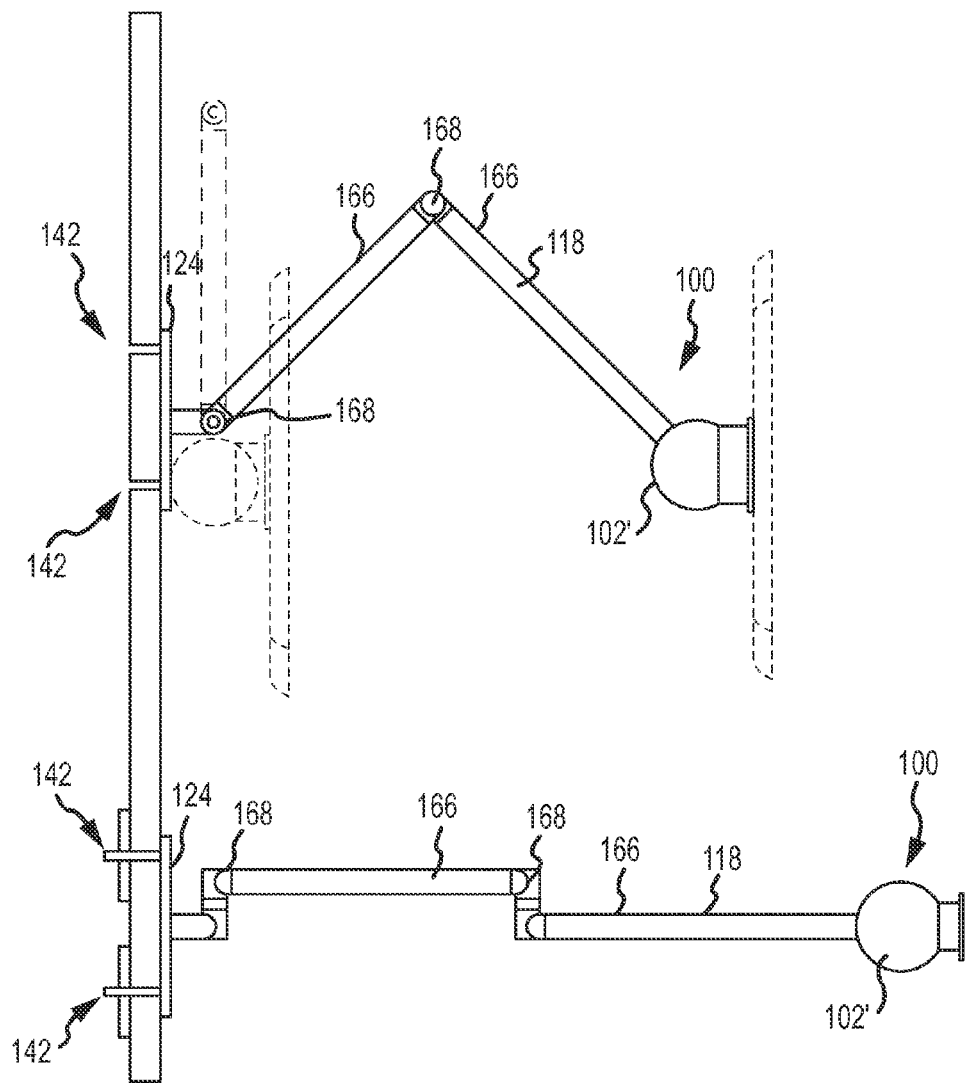
FIG. 15 depicts embodiments of a support structure including an articulating arm for use with an embodiment of a mount system.
Figure 16:
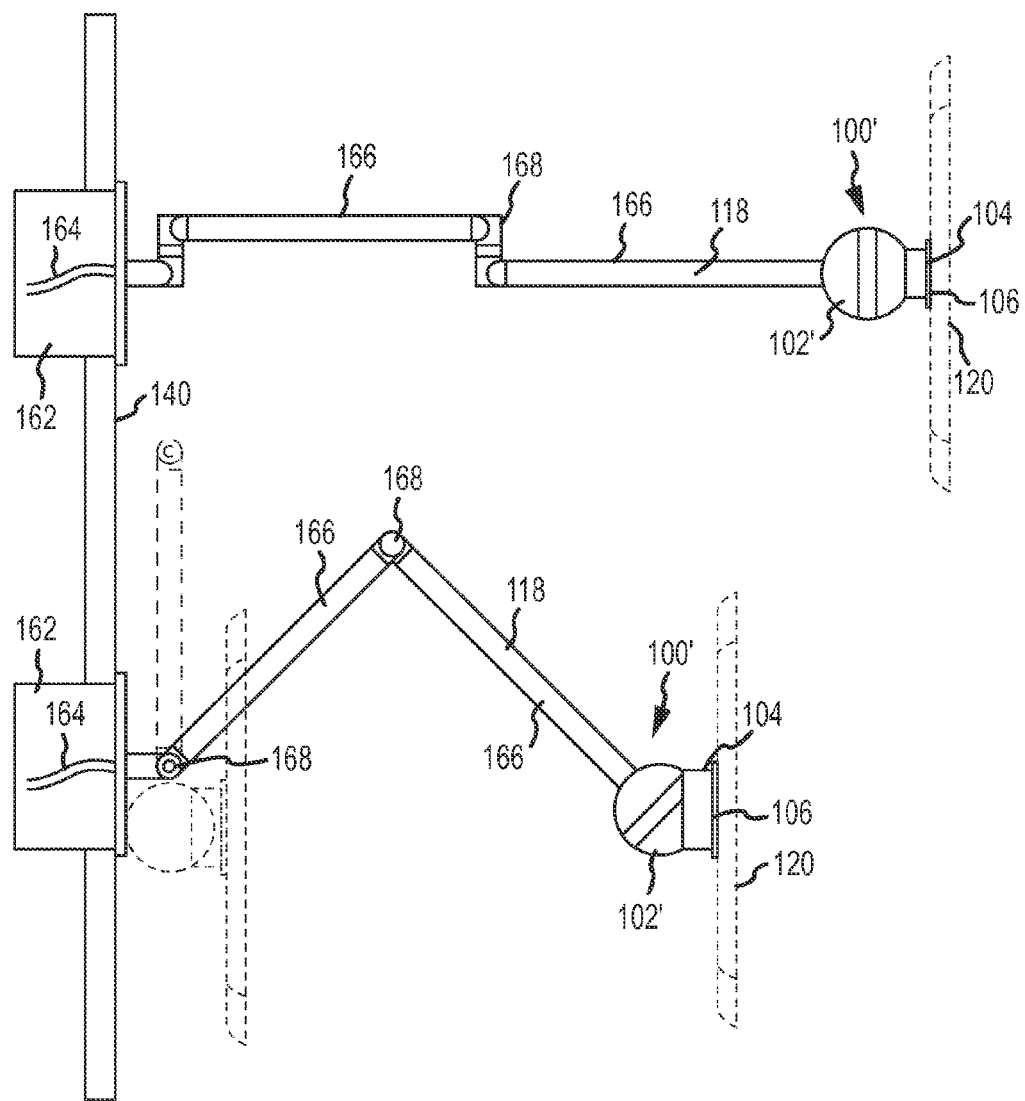
FIG. 16 depicts another embodiment of a support structure with an articulating arm for use with an embodiment of a mount system.

FIG. 15 depicts another embodiment wherein a support arm 118 of the mounting system 100 includes articulated sections 166 for movement of the bulbous member 102 with respect to a base 124. The top portion of FIG. 15 shows a side view of the embodiment and the bottom portion of FIG. 15 shows a top view. As shown, the articulated sections 166 may be connected by a hinge 168 (e.g., comprising a swivel, ball joint, or other joint arrangement known in the art) to facilitate movement of the mounting system 100 with respect to the base 124 from a retracted configuration (shown in phantom lines in the top portion of FIG. 15) to an extended configuration. As shown in FIG. 16, a support structure including articulated sections 166 be provided with an embodiment requiring power. As such, the embodiment in FIG. 16 is shown attached to a junction box 162 to facilitate communication with standard electrical wiring 164 in a manner discussed above with respect to FIG. 14.

Figure 17:
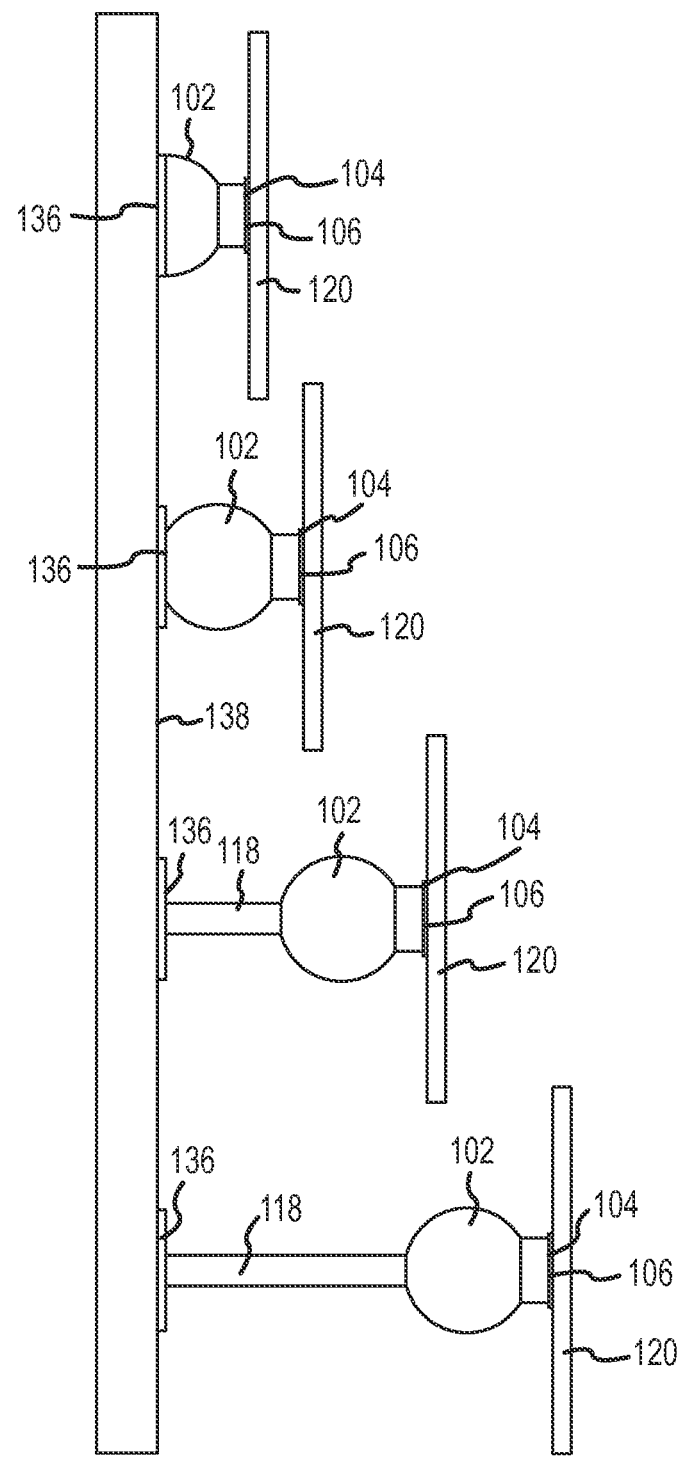
FIG. 17 depicts additional embodiments of support structures for use with an embodiment of a mount system.

With respect to FIG. 17, different techniques for attachment of a bulbous member 102 to a supporting magnet 136 are shown. The top most portion of FIG. 17 depicts a hemispherical bulbous member 102 in supportive engagement with a supporting magnet 136 which is in turn is magnetically interacting with a magnetic substrate 138. Also shown in FIG. 17 is a substantially spherical bulbous member 102 in supportive engagement with a support magnet 136 that is in turn magnetically interactive with a magnetic substrate 138. Additionally shown in FIG. 17, various lengths of support arms 118 may be provided in supportive engagement with the bulbous member 102 that are attached to a support magnet 136 which in turn engages a magnetically interactive substrate 138.

Figure 18:
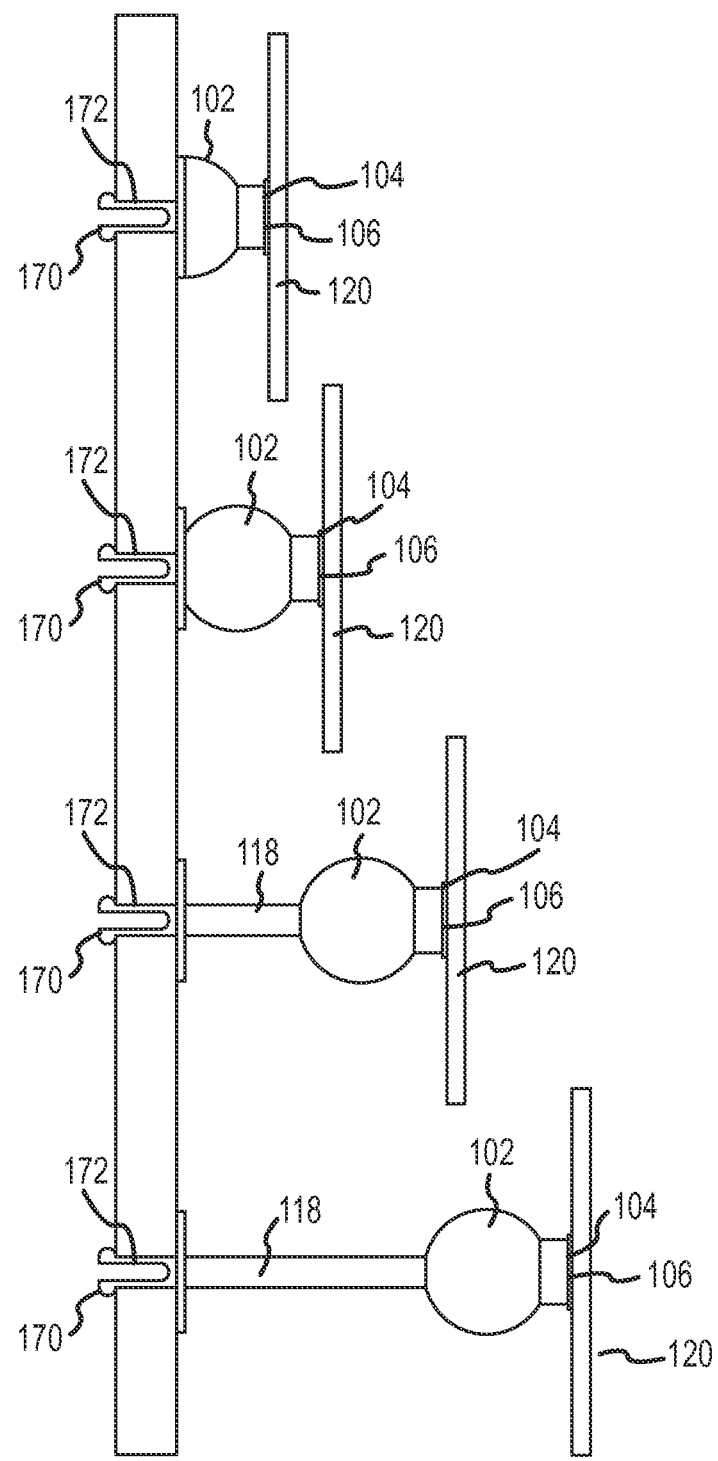
FIG. 18 depicts still further embodiments of support structures for use with an embodiment of a mount system.
Figure 19A:
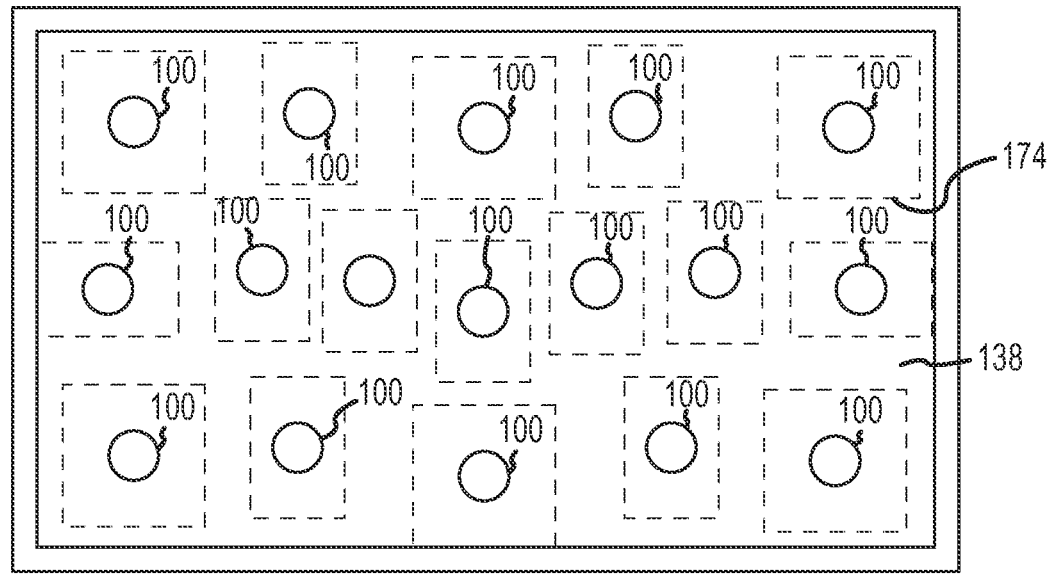
FIGS. 19A and 19B depict an embodiment of a magnetic frame employing an embodiment of a mount system.
Figure 19B:
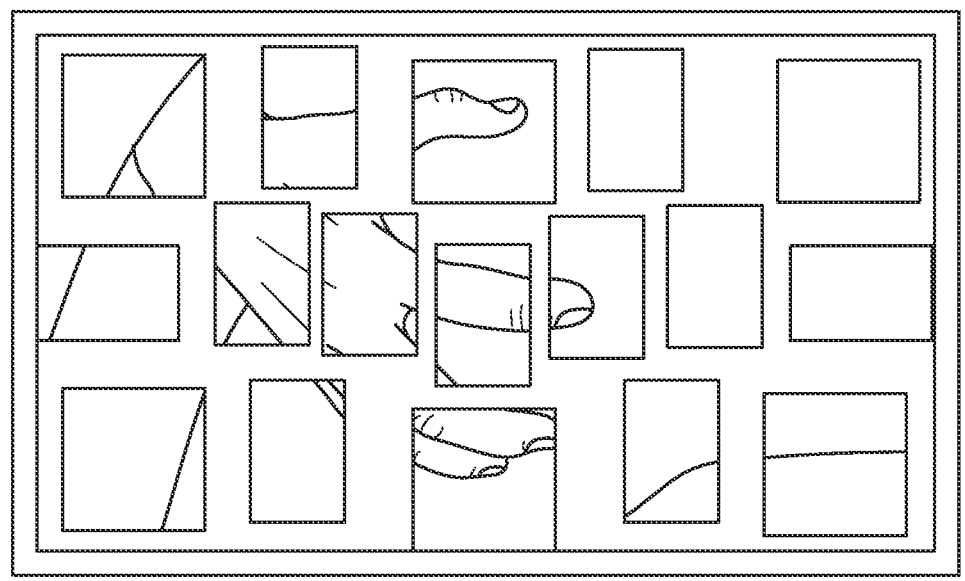

FIG. 18 depicts embodiments for connection of a mounting system with a wall 140. The bulbous members 102 may be in supportive engagement with a clip 170 that may be disposed in a preexisting hole 172 (e.g., such as a hole provided in a peg board, a pre-drilled hole, or the like). As discussed above with respect to FIG. 18, the bulbous member 102 may be a portion of a sphere or substantially all of a sphere and may be directly connected to the clip 170 or connected to the clip 170 by way of a support arm 118.

Figure 20A:
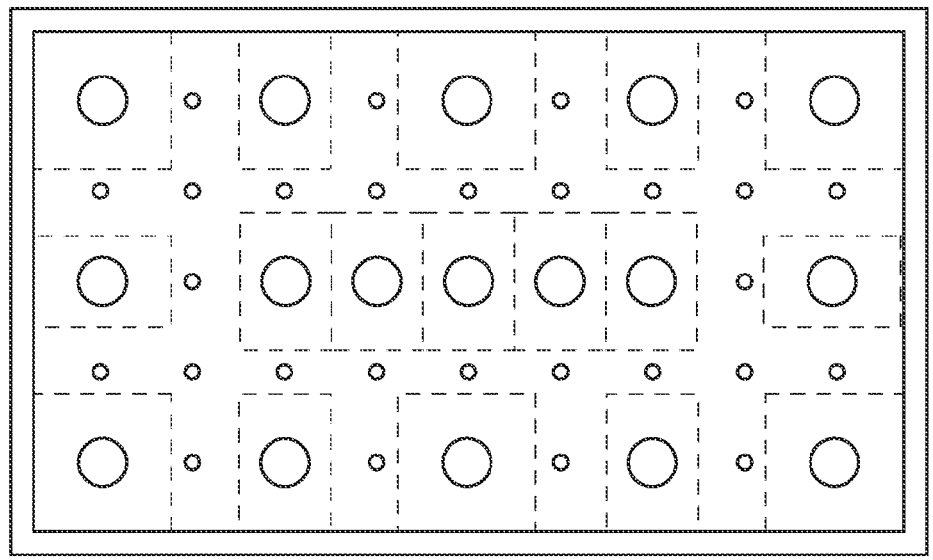
FIGS. 20A and 20B depict an embodiment of a frame for use with an embodiment of a mount system.
Figure 20B:
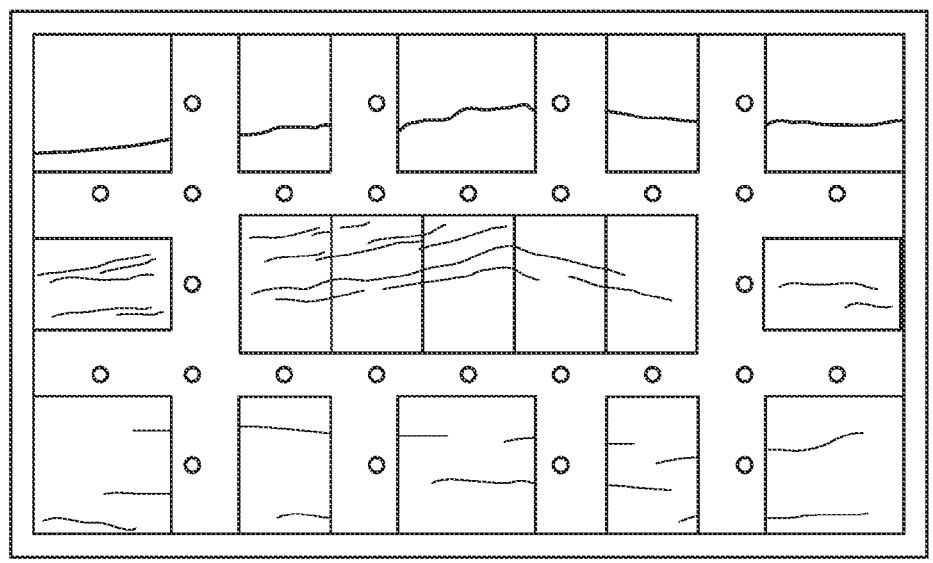

FIGS. 19A-20B depict various embodiments of display techniques that may be accomplished by way of the use of a mounting system as described above. For example, with reference to FIGS. 19A to 20B, multiple mounting systems 100 may be provided at various locations on a frame 174 such that magnetic interaction between a support magnet attached to the mounting system 100 and a magnetic substrate 138 retains the mounting systems 100 to the frame 174. In this regard, various devices or portions of art may be mounted to the mounting portions 100 as shown in FIG. 19B. With respect to FIG. 20A, discrete mounting locations (e.g., preexisting holes 172 of a pegboard) may be provided to which mounting systems 100 may be engaged. As shown in FIG. 20B, various portions of art or other devices for example may be provided on the mounting systems provided in the discrete locations to provide a framed display incorporating a mounting system described above.

The foregoing description of the present invention has been presented for purposes of illustration and description. Furthermore, the description is not intended to limit the invention to the form disclosed herein. Consequently, variations and modifications commensurate with the above teachings, and skill and knowledge of the relevant art, are within the scope of the present invention. The embodiments described hereinabove are further intended to explain known modes of practicing the invention and to enable others skilled in the art to utilize the invention in such or other embodiments and with various modifications required by the particular application(s) or use(s) of the present invention. It is intended that the appended claims be construed to include alternative embodiments to the extent permitted by the prior art.

What is claimed is:

1. A mount for supporting a device, the mount comprising:
   a bulbous member that is supportably engageable with a base, the bulbous member comprising a convexly curved surface area, wherein at least a portion of the convexly curved surface area is unobstructed;
   a carrier member comprising a first interconnect portion and a second interconnect portion, wherein the first interconnect portion comprises a concave surface area for conformal adjacent engagement with the convexly curved surface area, and wherein at least a portion of the concave surface area is supportively contactable with the convexly curved surface area, and wherein the concave surface area is selectively positionable with respect to the convexly shaped surface area throughout a continuum of positions across the unobstructed portion of the convexly shaped surface area; and an attachment member operatively associable with a device, the attachment member being removably attachable to the second interconnect portion of the carrier member, wherein the device is supportably engageable with the second interconnect portion;

wherein the bulbous member, the carrier member, and the attachment member each comprises a magnetic portion, at least one of the magnetic portions comprise at least one magnet, wherein magnetic interaction between respective ones of the magnetic portions is operable to selectively establish the supportive contact between the convexly curved surface area and the concave surface area and the removable attachment of the attachment member to the second interconnect portion.

2. A mount according to claim 1, wherein the magnetic portion of the carrier member comprises the at least one magnet and each of the magnetic portions of the bulbous member and the attachment member each comprise magnetically interactive portions attractable to the magnet.

3. A mount according to claim 2, wherein the first interconnect portion is disposed on a first end portion of the carrier member and the second interconnect portion is disposed on a second end portion of the carrier member.

4. A mount according to claim 3, wherein the first end portion and the second end portion are disposed on opposite ends of the carrier member.

5. A mount according to claim 4, wherein the at least one magnet is disposed at least partially between the first end portion and the second end portion.

6. A mount according to claim 5, wherein the carrier member includes a first magnet disposed adjacent to the first interconnect portion and a second magnet disposed adjacent to the second interconnect portion.

7. A mount according to claim 6, wherein the first magnet and the second magnet produce magnetic fields with different properties at the first interconnect portion and the second interconnect portion.

8. A mount according to claim 6, wherein the second magnet is operable to register the attachment member relative to the second interconnect portion.

9. A mount according to claim 8, wherein the force required to remove the attachment member from the carrier member is less than the force required to remove the carrier member from the bulbous member.

10. A mount according to claim 9, wherein the strength of the magnetic field at the second interconnect portion is less than the strength of the magnetic field at the first interconnect portion.

11. A mount according to claim 10, wherein the static coefficient of friction between the attachment member and the carrier member is greater than the static coefficient of friction between the carrier member and the bulbous member.

12. A mount according to claim 11, wherein a force applied to at least one of the attachment member and the device comprising a force component tangential to the convexly curved surface area results in sliding relative movement between the carrier member and the bulbous member prior to sliding relative movement between the attachment member and the carrier member.

13. A mount according to claim 2, wherein the concave surface area remains stationary with respect to the convexly curved surface area upon attachment of the device to the second interconnect portion when the concave surface area is in supportive contact with the convexly curved surface area.

14. A mount according to claim 13, wherein the concave surface area provides for conformal surface to surface contact between the concave surface area and the convexly curved surface area across substantially all of the concave surface area.

15. A mount according to claim 14, wherein the magnetic interaction between the magnetic portions of the bulbous member and the carrier member maintains the concave surface area stationary with respect to the convexly curved surface area.

16. A mount according to claim 15, wherein an external force acting on the carrier member is required to move the carrier member throughout the continuum of positions of the convexly curved surface area.

17. A mount according to claim 16, wherein the convexly curved surface area comprises an at least partially spherical surface.

18. A mount according to claim 17, wherein the bulbous member is substantially spherical and the unobstructed portion of the convexly curved surface area comprises at least a majority of the spherical surface area of the at least partially spherical surface.

19. A mount according to claim 18, wherein the second interconnect portion is substantially planar.

20. A mount according to claim 19, wherein the attachment member comprises an annular disk.

21. A mount according to claim 20, wherein the attachment member is operatively attached to a case engageable with the device.

22. A mount according to claim 20, wherein the device comprises an integrated attachment member.

23. A mount according to claim 1, wherein the supportive contact of the concave surface area with respect to the convexly curved surface area is established only by the magnetic interaction between the carrier member and the bulbous member.

24. A mount according to claim 1, further comprising a plurality of attachment members operatively associable with a corresponding plurality of devices, wherein the plurality of devices are interchangeably retained by the mount by magnetic interaction with a respective one of the plurality of attachment members and the second interface portion.

25. A mount according to claim 1, wherein the attachment member comprises at least one electrical conductor portion, and wherein the carrier member comprises at least one electrical connector, and wherein the at least one electrical conductor portion establishes electrical communication with the at least one electrical conductor when the attachment member is attached to the carrier member.

26. A mount according to claim 25, further comprising:
a power source in operative communication with the electrical connector of the carrier member.

27. A mount according to claim 26, wherein the power source is in conductive communication with the carrier member.

28. A mount according to claim 27, wherein the power source is in inductive communication with the carrier member.

29. A mount according to claim 27, wherein the attachment member is in operative communication with a port of a device operable to charge the device.

30. A mount according to claim 29, wherein the power source is in operative communication with the port of the device when the attachment member is attached to the carrier member.

31. A method for supportably mounting a device, comprising:
- attaching a first interconnect portion of a carrier member in supportive contact with a convexly curved surface area of a bulbous member, wherein the first interconnect portion comprises a concave surface area for conformal adjacent engagement with the convexly curved surface area;
- positioning the concave surface area with respect to the convexly shaped surface area within a continuum of positions across an unobstructed portion of the convexly curved surface area;
- connecting an attachment member to a second interconnect portion of the carrier member, wherein the attachment member is operatively associable with a device; and
- supporting the device with respect to the bulbous member in response to the connecting, wherein the device is selectively removable from the carrier member by selective disengagement of the attachment member from the second interconnect portion;
- wherein the bulbous member, the carrier member, and the attachment member each comprises a magnetic portion, and at least one of the magnetic portions comprise a magnet, and wherein the attaching, connecting and supporting are in response to magnetic interaction between respective ones of the magnetic portions.

* * * * *